(12) United States Patent
Kuenle et al.

(10) Patent No.: US 11,149,351 B2
(45) Date of Patent: Oct. 19, 2021

(54) APPARATUS AND METHOD FOR CHEMICAL VAPOR DEPOSITION PROCESS FOR SEMICONDUCTOR SUBSTRATES

(71) Applicant: Infineon Technologies AG, Neubiberg (DE)

(72) Inventors: Matthias Kuenle, Villach (AT); Johannes Baumgartl, Riegersdorf (AT); Manfred Engelhardt, Villach (AT); Christian Illemann, Villach (AT); Francisco Javier Santos Rodriguez, Villach (AT); Olaf Storbeck, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 475 days.

(21) Appl. No.: 15/700,232

(22) Filed: Sep. 11, 2017

(65) Prior Publication Data
US 2019/0078211 A1    Mar. 14, 2019

(51) Int. Cl.
| | |
|---|---|
| *C23C 16/54* | (2006.01) |
| *C23C 16/455* | (2006.01) |
| *C30B 25/12* | (2006.01) |
| *C23C 16/458* | (2006.01) |
| *C23C 16/46* | (2006.01) |
| *C23C 16/02* | (2006.01) |
| *C30B 25/10* | (2006.01) |

(Continued)

(52) U.S. Cl.
CPC .......... *C23C 16/54* (2013.01); *C23C 16/0209* (2013.01); *C23C 16/4584* (2013.01); *C23C 16/45502* (2013.01); *C23C 16/45517* (2013.01); *C23C 16/46* (2013.01); *C30B 25/10* (2013.01); *C30B 25/12* (2013.01); *C30B 25/14* (2013.01); *C30B 29/06* (2013.01); *C30B 29/36* (2013.01); *H01L 21/0262* (2013.01); *H01L 21/02529* (2013.01); *H01L 21/02576* (2013.01); *H01L 21/02579* (2013.01)

(58) Field of Classification Search
CPC ................ C23C 16/54; C23C 16/0209; C23C 16/45502; C23C 16/45517; C23C 16/4584; C23C 16/46; C30B 25/10; C30B 25/12; C30B 25/14; C30B 29/06; C30B 29/36; H01L 21/02529; H01L 21/02576; H01L 21/0279; H01L 21/0262
USPC .................................................... 118/719, 728
See application file for complete search history.

(56) References Cited

U.S. PATENT DOCUMENTS

| | | | | |
|---|---|---|---|---|
| 3,956,032 A | * | 5/1976 | Powell | C30B 25/02 117/101 |
| 4,839,145 A | * | 6/1989 | Gale | C23C 16/54 118/725 |

(Continued)

*Primary Examiner* — Charlee J. C. Bennett
(74) *Attorney, Agent, or Firm* — Viering, Jentschura & Partner MBB

(57) ABSTRACT

A CVD reactor, including a deposition chamber housing a first susceptor and a second susceptor, the first susceptor having a cavity for receiving a first substrate, the first substrate having a front surface and a back surface, the second susceptor having a cavity for receiving a second substrate, the second substrate having a front surface and a back surface, and the first susceptor and the second susceptor are disposed so that the front surface of the first substrate is opposite to the front surface of the second substrate thereby forming a portion of a gas flow channel.

17 Claims, 25 Drawing Sheets

(51) Int. Cl.
    *C30B 25/14*     (2006.01)
    *H01L 21/02*     (2006.01)
    *C30B 29/06*     (2006.01)
    *C30B 29/36*     (2006.01)

(56) References Cited

U.S. PATENT DOCUMENTS

| | | | | |
|---|---|---|---|---|
| 4,858,558 | A * | 8/1989 | Ohmura | C23C 16/44 118/725 |
| 5,062,386 | A * | 11/1991 | Christensen | C23C 16/45506 118/725 |
| 5,108,792 | A * | 4/1992 | Anderson | C23C 16/44 118/715 |
| 5,273,588 | A * | 12/1993 | Foster | C23C 16/455 118/715 |
| 5,910,218 | A * | 6/1999 | Park | C23C 16/405 118/719 |
| 6,002,109 | A * | 12/1999 | Johnsgard | C23C 16/4411 118/50.1 |
| 6,191,035 | B1 * | 2/2001 | Cheng | H01L 21/28568 118/715 |
| 2006/0163201 | A1 * | 7/2006 | Getty | H01J 37/32541 216/67 |
| 2009/0235867 | A1 * | 9/2009 | Fujikawa | C30B 25/12 118/728 |
| 2013/0276704 | A1 * | 10/2013 | Krishnan | C23C 16/4584 118/725 |
| 2016/0230279 | A1 * | 8/2016 | Newton | C23C 16/342 |

\* cited by examiner

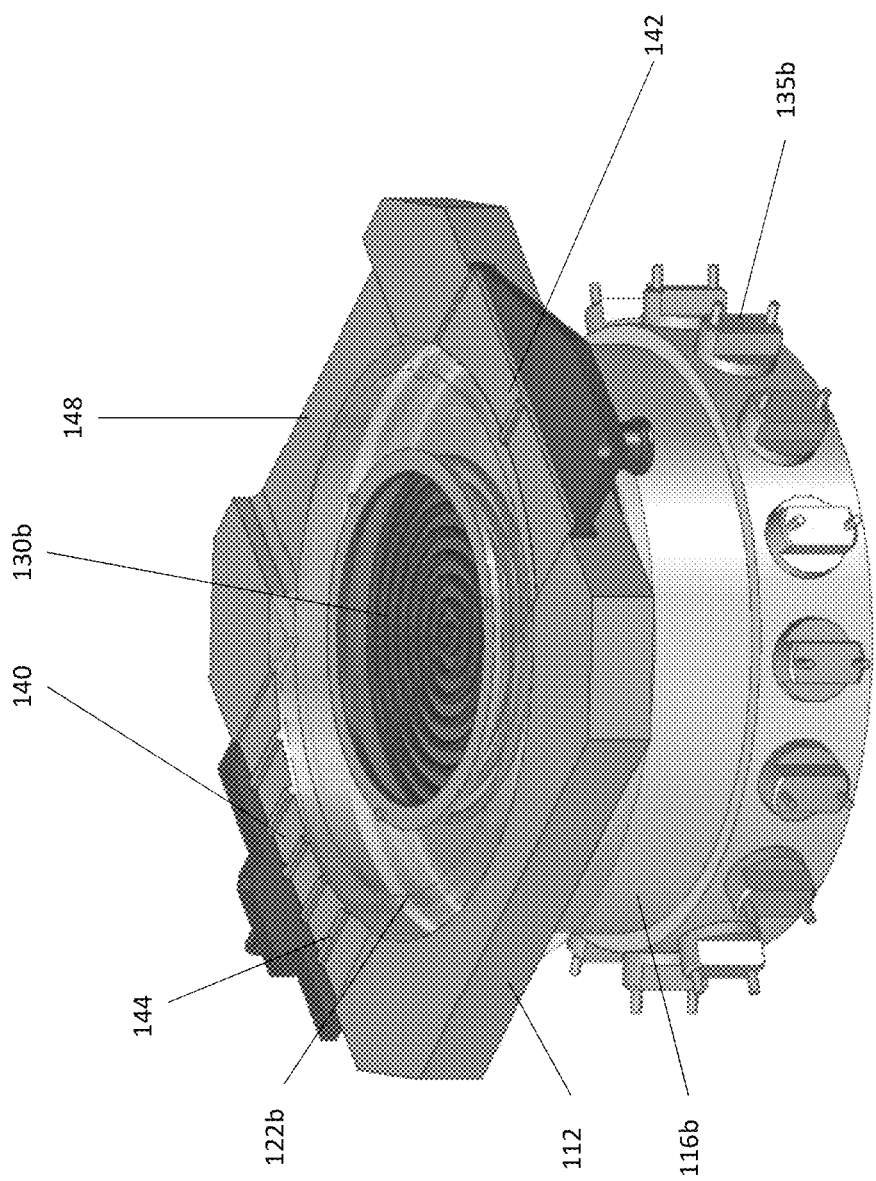

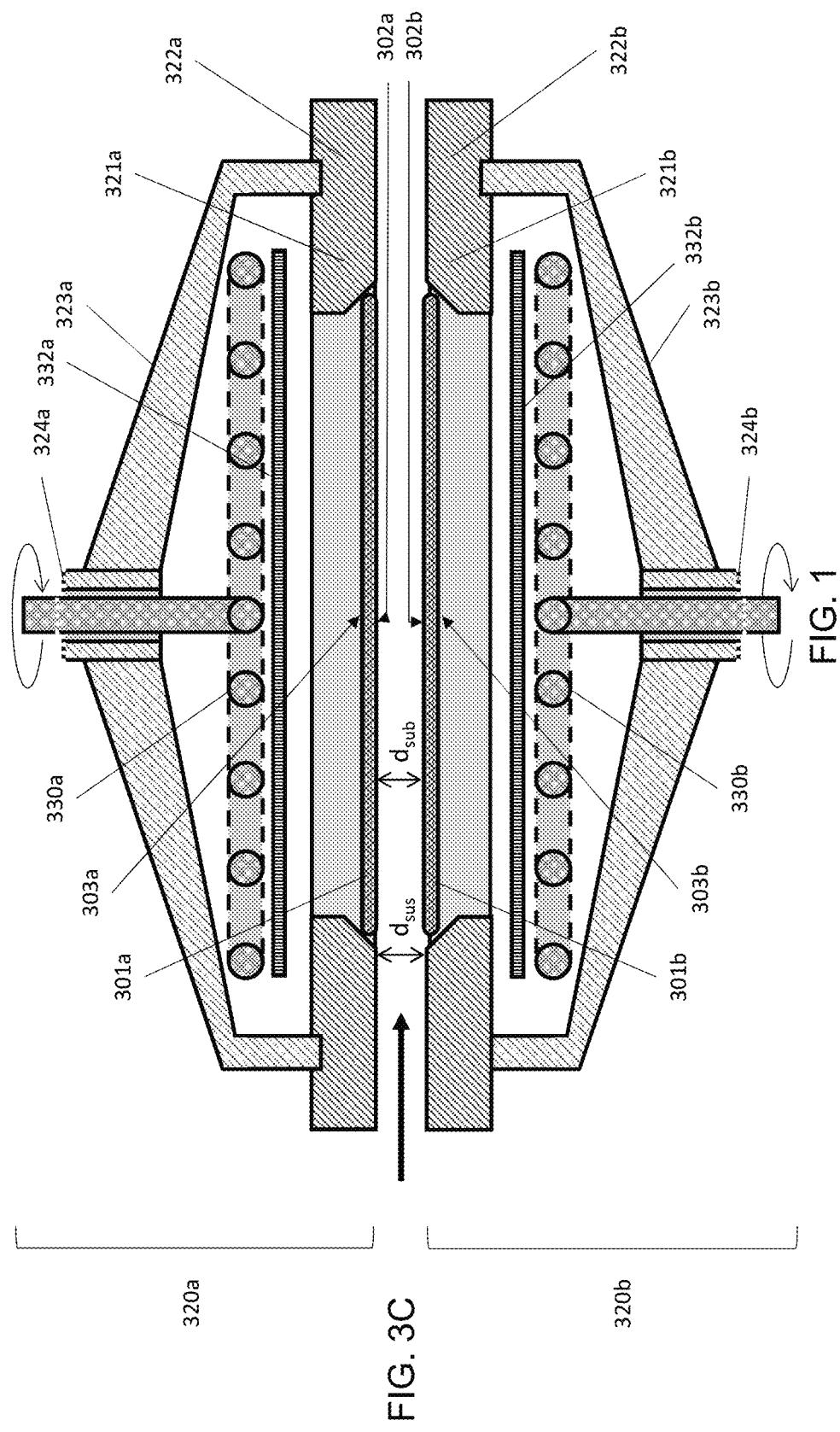

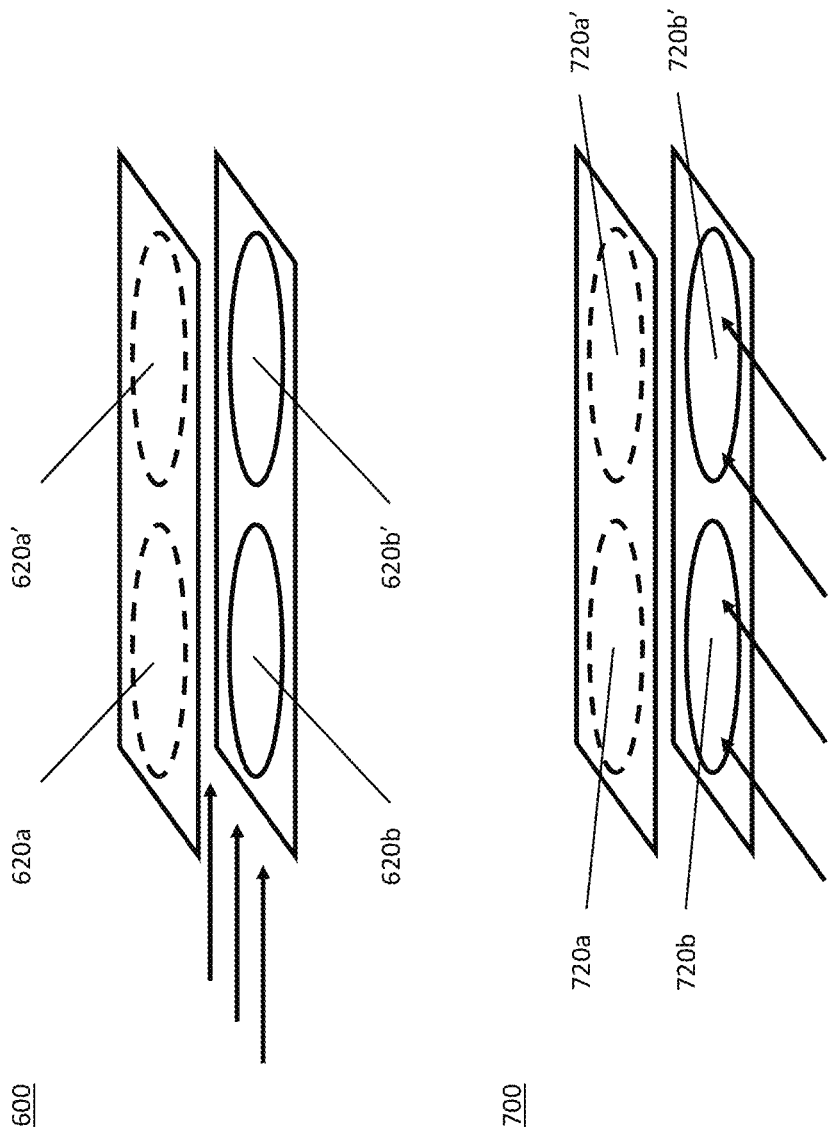

APPARATUS AND METHOD FOR CHEMICAL VAPOR DEPOSITION PROCESS FOR SEMICONDUCTOR SUBSTRATES

TECHNICAL FIELD

Various embodiments relate generally to apparatuses and methods for chemical vapor deposition process for semiconductor substrates.

BACKGROUND

A chemical vapor deposition (CVD) process may be used to deposit thin films on semiconductor substrates (e.g., silicon wafers). In the CVD process, a substrate is exposed to one or more volatile gases which react and/or decompose on the substrate surface to produce a thin film. The CVD process may be used to deposit different types of thin film layers including for example monocrystalline layers, polycrystalline layers, amorphous layers, and epitaxial layers. The deposition of epitaxial layers with uniform thickness and doping is important in the manufacture of semiconductor devices.

Commercially available CVD reactors can be divided into two main categories: single-substrate reactors which process a single substrate at a time and batch-type reactors which process a plurality of substrates at a time. Batch-type reactors including "barrel"-type systems and "pancake"-type systems are efficient but do not provide epitaxial layers that are sufficiently uniform for some semiconductor devices. Single-substrate reactors can produce relatively uniform epitaxial layers but the process is time and resource consuming.

The single-substrate CVD reactors can be further divided into three categories: cold wall reactors (deposition chamber wall is at room temperature), hot wall reactors (deposition chamber wall is at process temperature), and warm wall reactors (deposition chamber wall is at a temperature between room temperature and process temperature). In a cold wall reactor, the high temperature gradient between the deposition chamber wall and the substrate surface reduces the uniformity of the layer thickness and dopant concentration. In a hot wall reactor, the higher temperature at the deposition chamber wall causes more process gases to decompose resulting in higher particle and by-product generation and depositions on the chamber wall which require more cleaning. A warm wall reactor is often used as a compromise between uniformity and efficiency.

SUMMARY

A CVD reactor, including a deposition chamber housing a first susceptor and a second susceptor, the first susceptor having a cavity for receiving a first substrate, the first substrate having a front surface and a back surface, the second susceptor having a cavity for receiving a second substrate, the second substrate having a front surface and a back surface, and the first susceptor and the second susceptor are disposed so that the front surface of the first substrate is opposite to the front surface of the second substrate thereby forming a portion of a gas flow channel.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1D shows a top perspective view of a portion of a CVD reactor according to at least one embodiment;

FIGS. 3A-3D show various configurations of a susceptor assembly pair of a CVD reactor according to at least one embodiment;

FIGS. 5A-5C show various configurations of a batch CVD reactor having a plurality of susceptor assembly pairs according to at least one embodiment.

DESCRIPTION

Various embodiments of the invention are explained in greater detail below, with reference to the accompanying figures. However, the invention is not restricted to the embodiments specifically described, but rather can be more suitably modified and altered. It lies within the scope of the invention to combine individual features and feature combinations of one embodiment with features and feature combinations of another embodiment in order to arrive at further embodiments according to the invention.

Identical elements are provided with the same or similar reference signs in the figures. A repeated description of these elements has been dispensed with in order to avoid repetition.

The basic principle presented here will be elucidated on the basis of the examples given below.

In accordance with various embodiments, a CVD reactor that accommodates at least two semiconductor substrates where the front surface of each substrate is face-to-face with each other so as to form a portion of a gas flow channel is provided. Process gases entering the gas flow channel from a gas inlet may be simultaneously exposed to the opposing front surfaces of the substrates in one common process. Because the deposition conditions are symmetrically identical, the layers generated on the opposing surfaces of each substrate have identical layer characteristics. Additionally, because the process gases decompose onto two front surfaces of the substrates in the gas flow channel, fewer by-products are generated resulting in improved gas yield and less parasitic deposition on the walls of the deposition chamber. The surface area to be cleaned is reduced by the area of the front surface of the second substrate. The structures accommodating the semiconductor substrates should be well sealed and process gases remain primarily within the gas flow channel. Only a small quantity of process gases should leak out of the gas flow channel. Consequently, the cleaning time between each CVD process is substantially reduced. This improves throughput by almost a factor of 2.

Figure 1A:
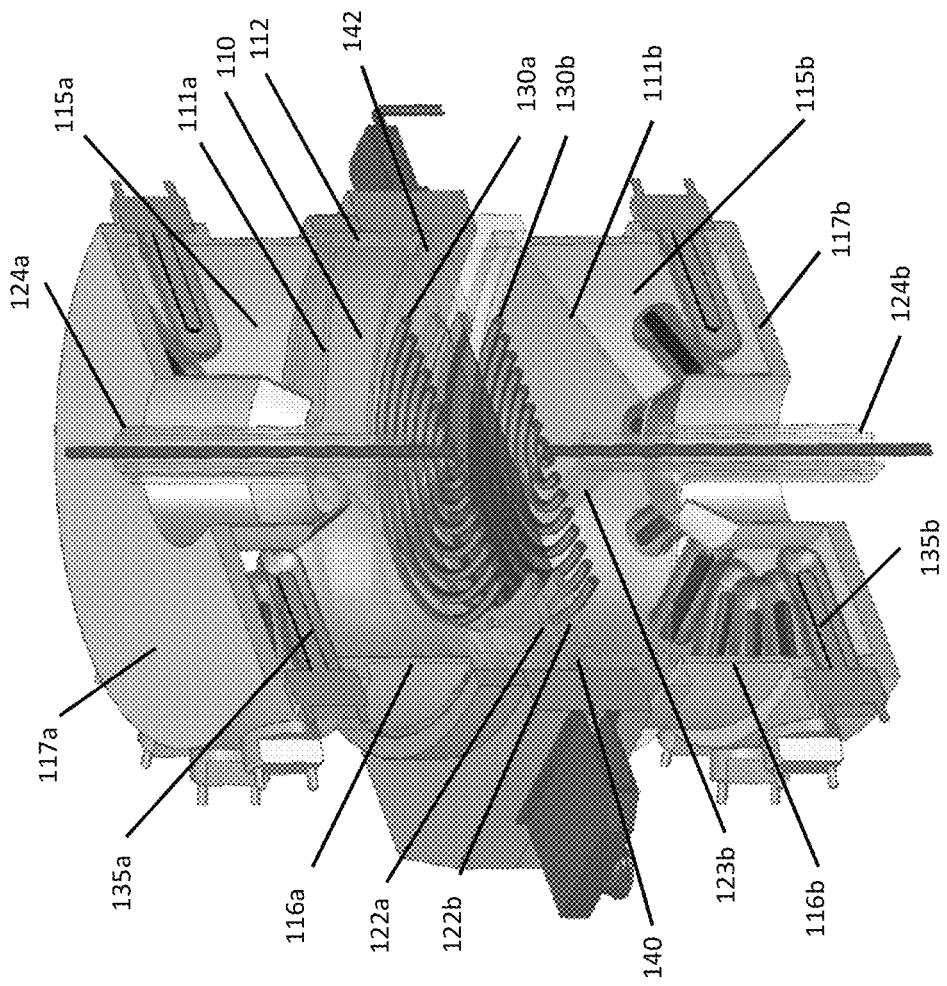
FIGS. 1A-1C show a first cross-sectional top perspective view, a cross-sectional side plan view, and a second cross-sectional top perspective view of a CVD reactor according to at least one embodiment.
Figure 1B:
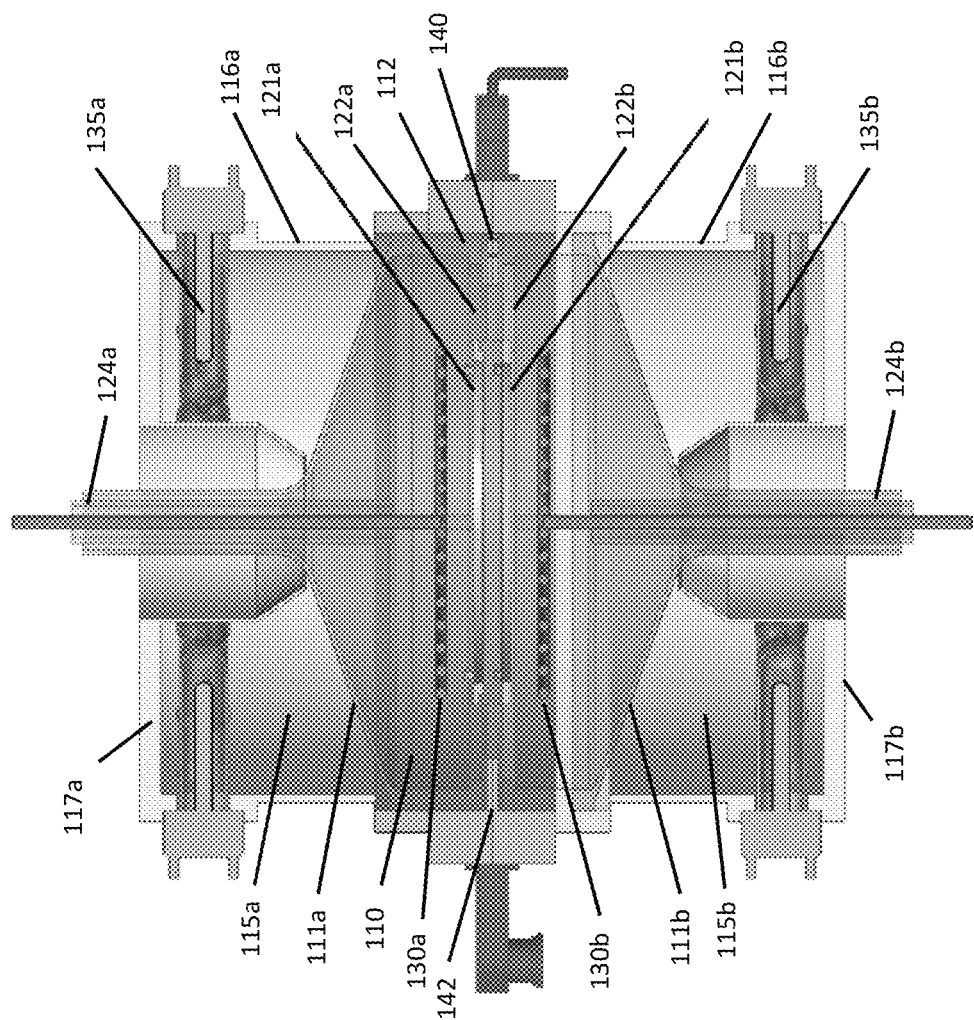
Figure 1C:
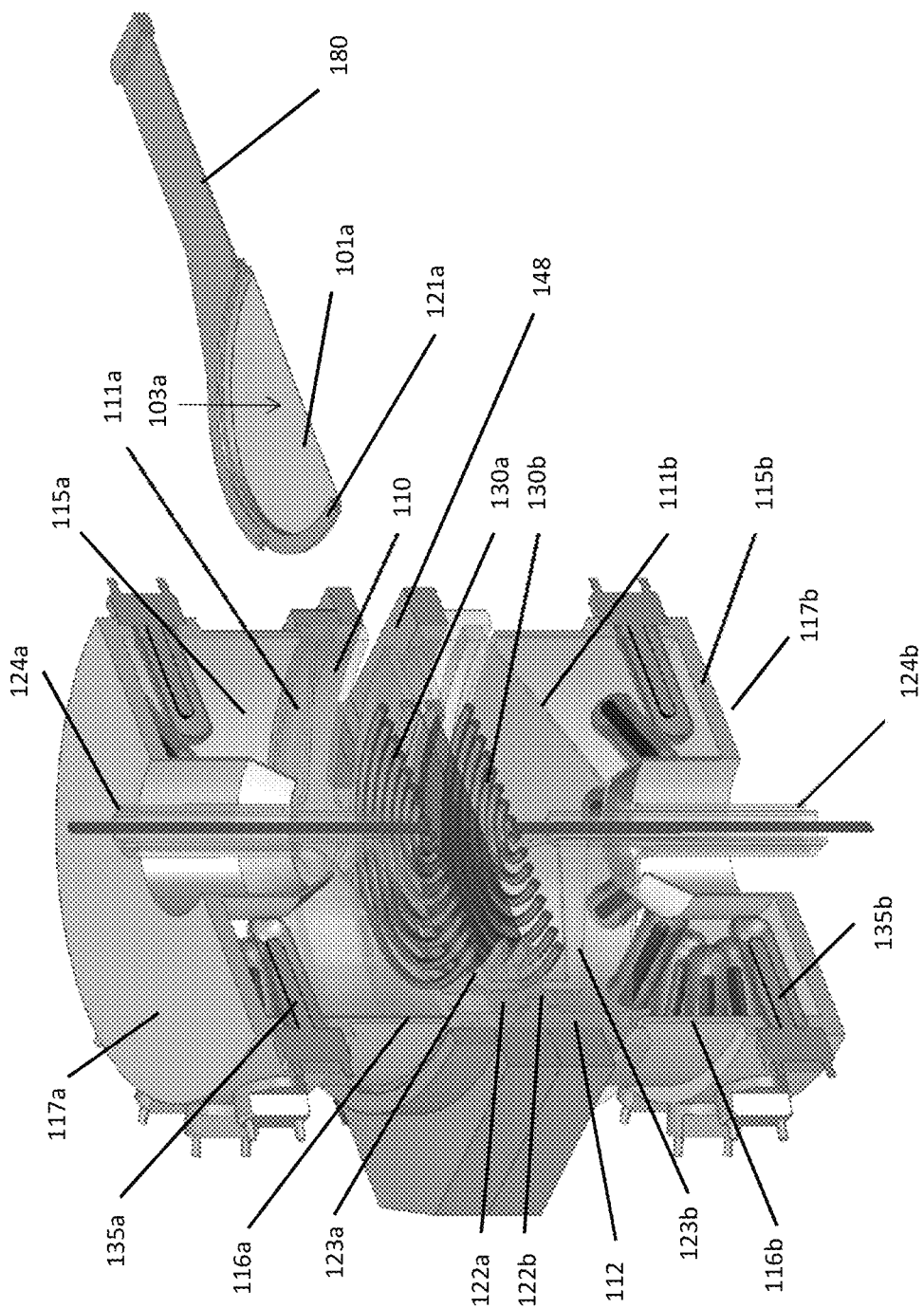
Figure 1E:
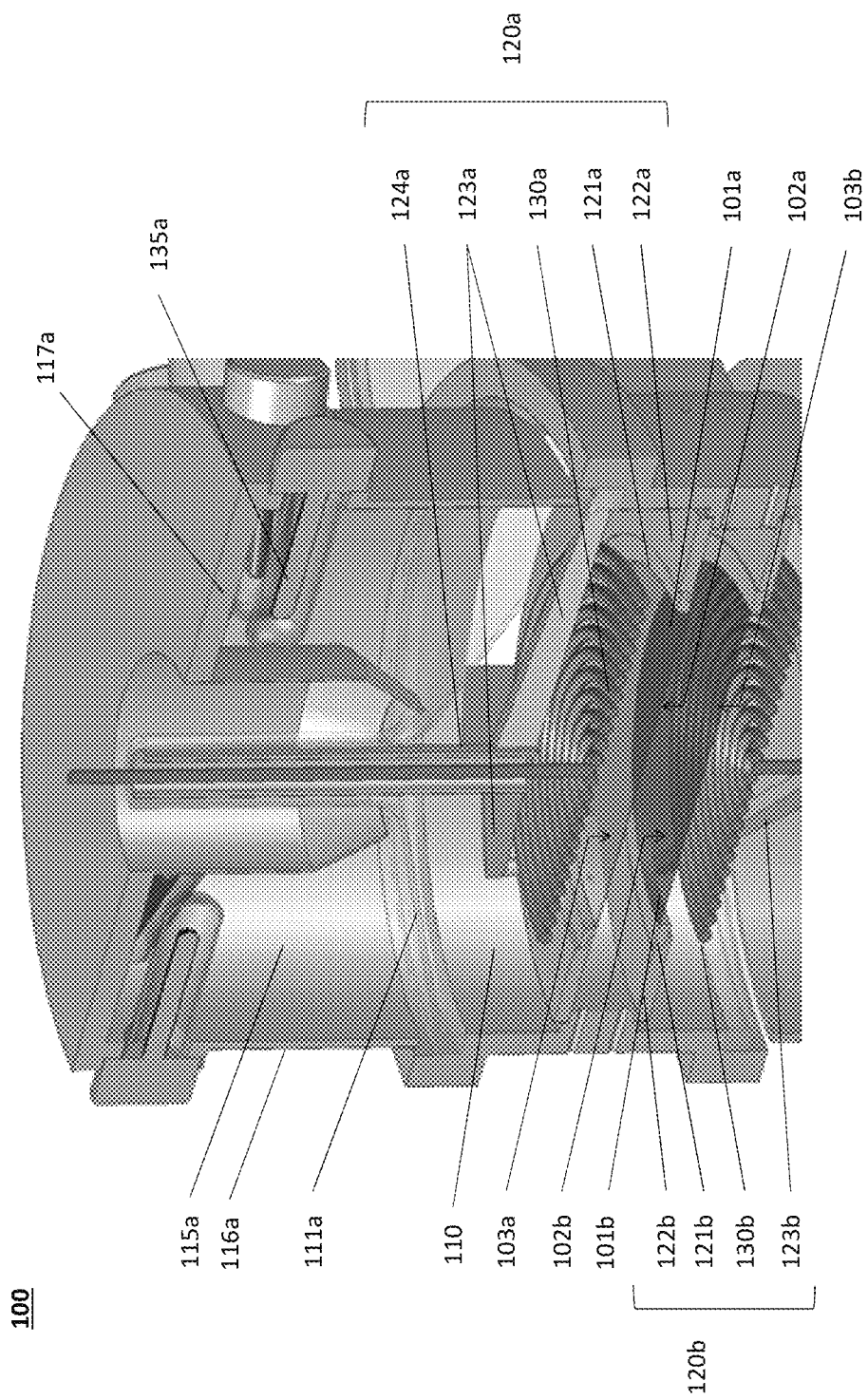
FIG. 1E shows an enlarged cross-sectional top perspective view of a portion of a CVD reactor according to at least one embodiment.
Figure 1F:
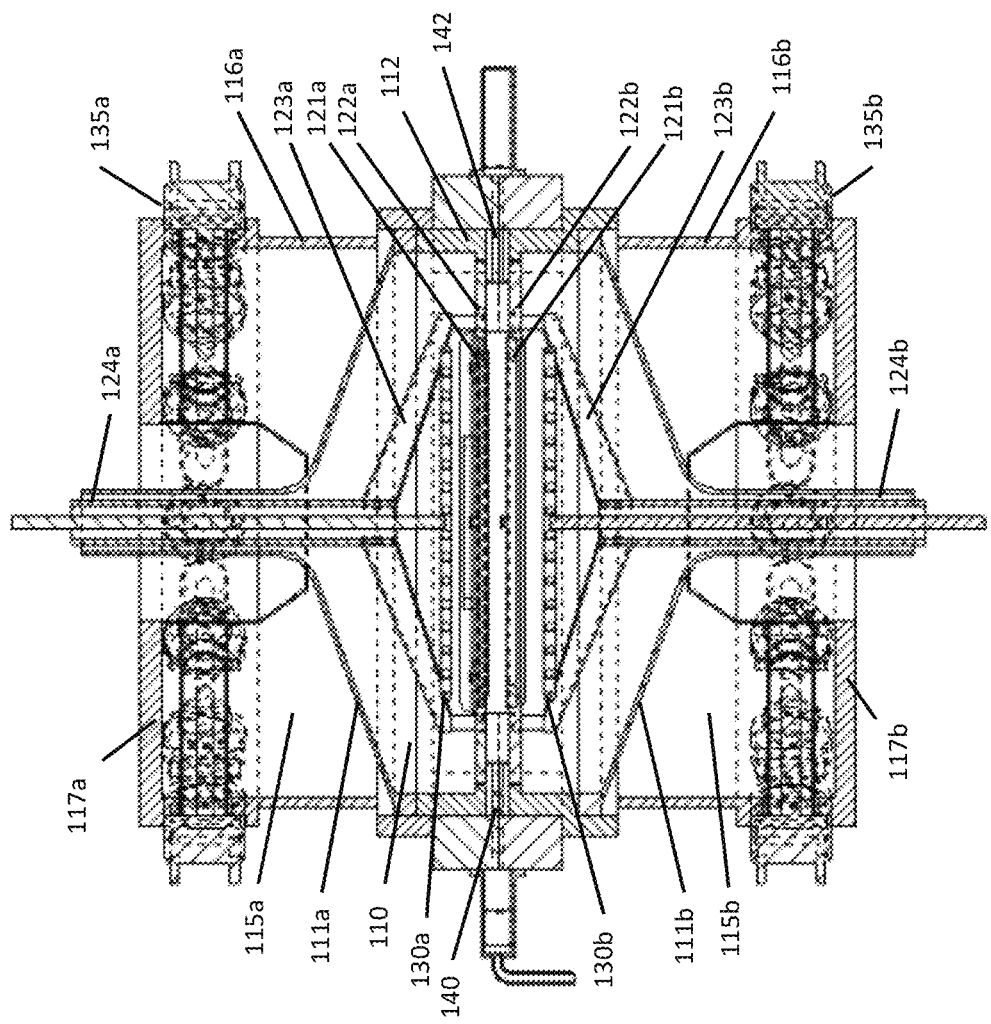
FIGS. 1F-1H are line drawings showing a first side plan view, a second side plan view, and a top view of a CVD reactor according to at least one embodiment.
Figure 1G:
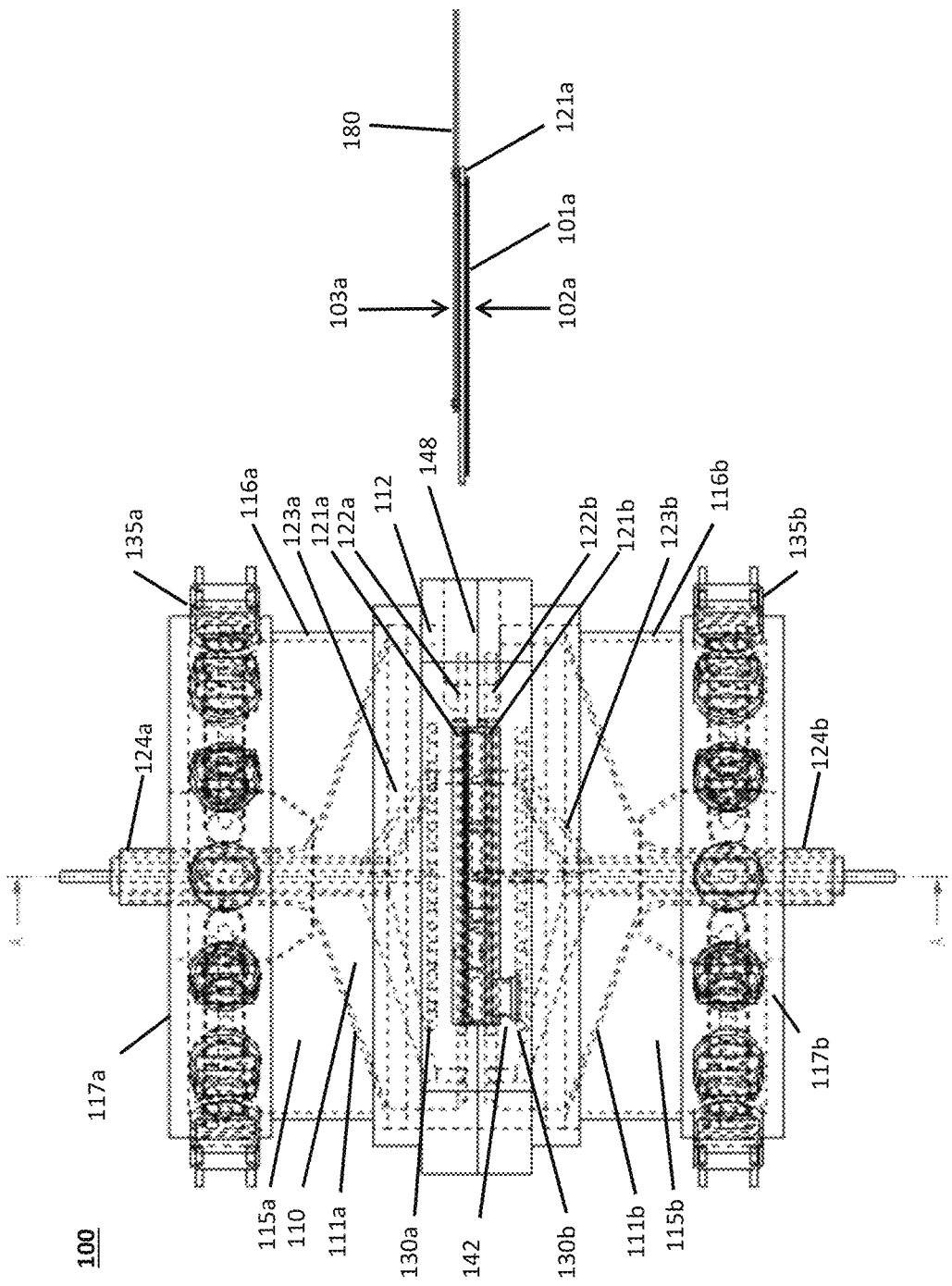
Figure 1H:
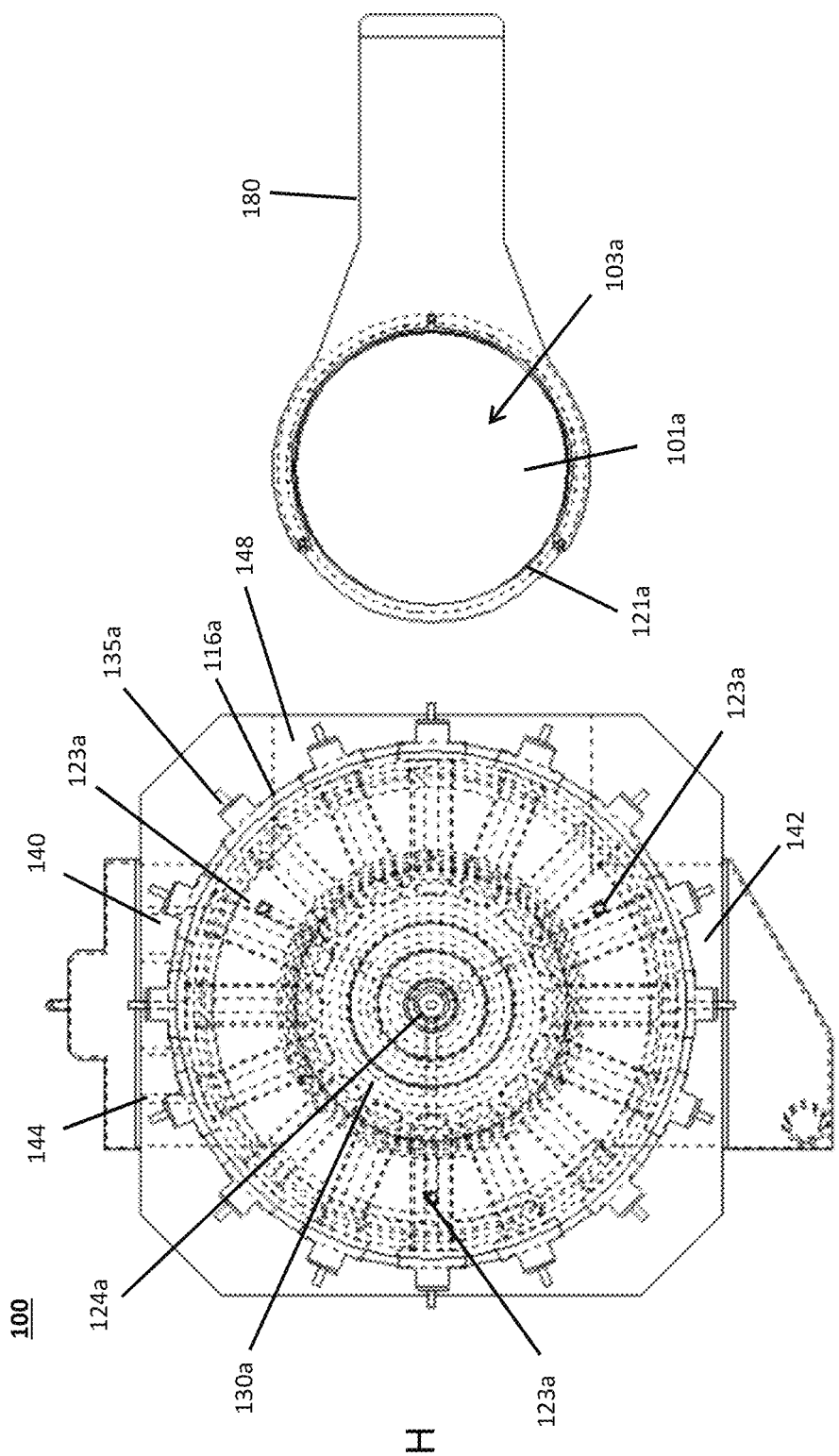

FIGS. 1A-1C show a first cross-sectional top perspective view, a cross-sectional side plan view, a second cross-sectional top perspective view of a CVD reactor 100 that can simultaneously deposit a thin film on two semiconductor substrates according to at least one embodiment. FIG. 1D shows a top perspective view of a portion of a CVD reactor 100 and FIG. 1E shows an enlarged cross-sectional top perspective view of a portion of a CVD reactor 100. FIGS. 1F-1H are line drawings showing a first side plan view, a second side plan view, and a top view of a CVD reactor 100 according to at least one embodiment. Referring to FIG. 1A, the CVD reactor 100 includes a deposition chamber 110 formed by coupling a first end wall 111a and a second end wall 111b to a side wall 112. Referring to FIG. 1E, the deposition chamber 110 contains a first susceptor assembly 120a and a second susceptor assembly 120b (partially shown). The first susceptor assembly 120a may be formed by a susceptor 121a coupled to a susceptor platform 122a that is mounted to susceptor supports 123a which extend from one end of a shaft 124a. The second susceptor assembly 120b may be symmetrically identical to the first susceptor assembly 120a or similarly configured. As shown in FIGS. 1A-1C and 1E, the first susceptor assembly 120a and the second susceptor assembly 120b are arranged opposite each other so that the first susceptor 121a faces the second susceptor 121b.

The susceptors 121a and 121b are each configured to receive a semiconductor substrate having a front surface that is a process surface and a back surface that is a non-process surface, i.e., the front surface or the process surface of a substrate should be exposed to process gases and the back surface or the non-process surface of a substrate should have limited exposure to process gases. As shown in FIG. 1E, when the substrates are mounted in the respective susceptors, the front surface 102a of the first substrate 101a is face-to-face to the front surface 102b of a second substrate 101b and forms a portion of a gas flow channel. The front surface 102a of a substrate 101a faces away from an susceptor assembly 120a and faces the gas flow channel. The back surface 103a of the substrate 101a faces towards an susceptor assembly 120a and faces away from the gas flow channel. In a symmetrical manner, the front surface 102b of a substrate 101b faces away from an susceptor assembly 120b and faces the gas flow channel. The back surface 103b of the substrate 101b faces towards an susceptor assembly 120b and faces away from the gas flow channel. As used herein, the term "front" used with regards to a side or surface of a structure generally refers to a side or surface of the structure that would face towards the gas flow channel and the term "back" used with regards to a side or surface of a structure generally refers to a side of the structure that would face away from the gas flow channel.

Figure 3A:
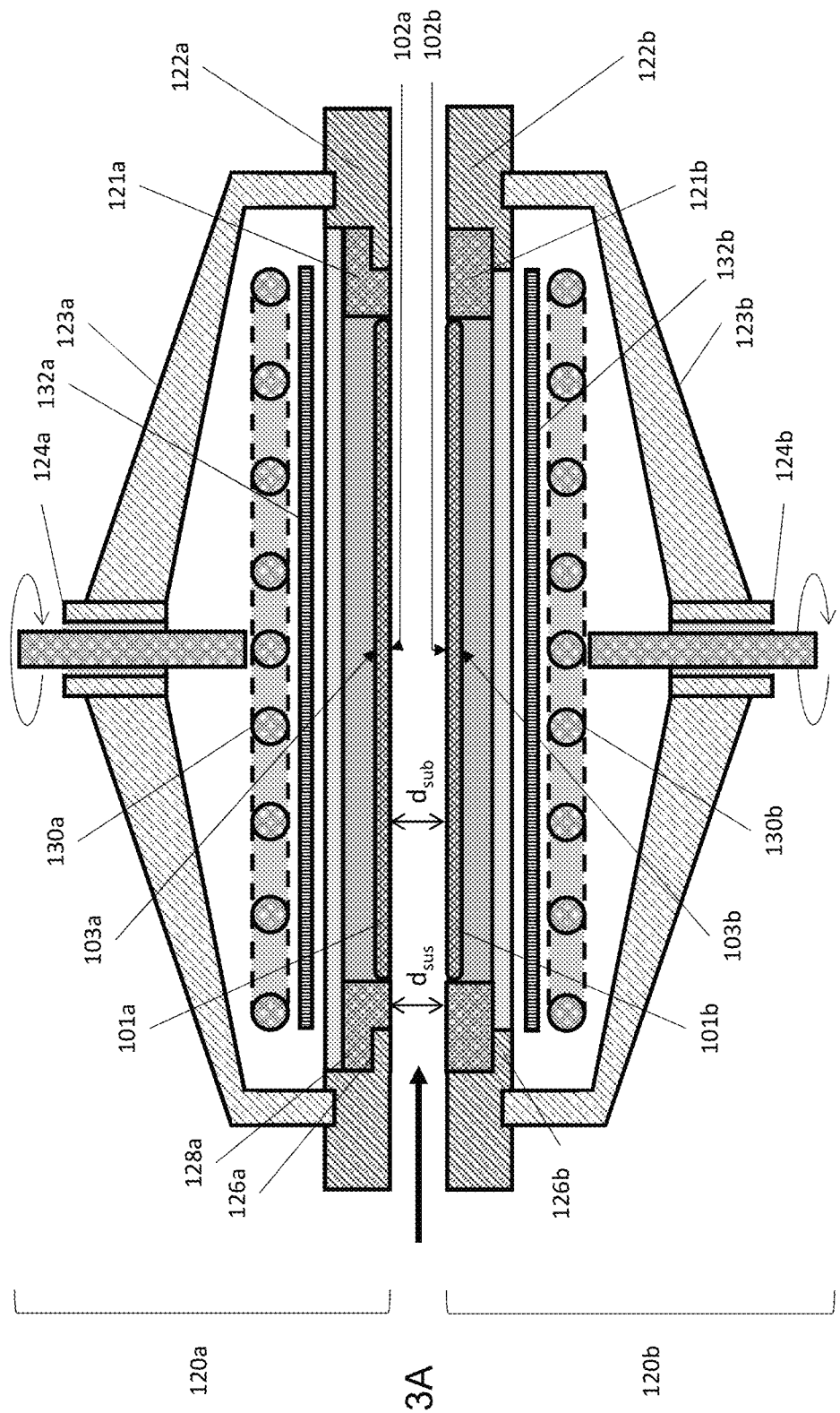

FIG. 3A shows a configuration of a susceptor assembly pair of a CVD reactor 100. As shown in FIG. 3A, the arrow indicates the direction of process gas flow. The opposing substrates 101a and 101b form a portion of a gas flow channel. In various embodiments, the front surfaces of the opposing susceptor platforms 122a and 122b and the front surfaces of the opposing susceptors 121a and 121b may also form a portion of the gas flow channel. To deposit an identical thin film layer, the opposing walls of the gas flow channel should be symmetrically identical (e.g., same geometries) or similarly configured. Thus, the opposing front surfaces of the first susceptor assembly 120a should be symmetrically identical to the opposing front surfaces of the second susceptor assembly 120b. For example, the front surface of a susceptor platform may be aligned with the front surface of a susceptor so that they are flush with each other and the front surface of a substrate may be aligned with the front surface of the susceptor so that they are flush with each other.

However, in various embodiments, the front surface of a substrate may not be aligned with the front surface of a susceptor so that they are in the same plane because the substrate and the susceptor are made from different material and they may have different heat conduction and emissivity characteristics. To accommodate the effects of these differences on the temperature in the gas flow path the distance between the different types of surfaces may be different. Referring to FIG. 3A, the distance $d_{sub}$ between the front surface 102a of substrate 101a and the front surface 102b of substrate 101b and the distance $d_{sus}$ between the front surface of the susceptor 121a and the front surface of the susceptor 121b may be configured differently to optimize the thickness uniformity of the deposited thin film layer. The distance $d_{sub}$ may be in the range from about 1 cm to about 2 cm. The distance $d_{sus}$ may be in the range of around ±1 mm relative to the distance $d_{sub}$ and the midpoints of $d_{sus}$ and $d_{sub}$ should be aligned along the center of the gas flow path. Thus, there may be an uneven surface at the junction between the front surface 102a of the substrate 101a and the front surface of the susceptor 121a and an uneven surface at the junction between the front surface 102b of the substrate 101b and the front surface of the susceptor 121b. To realize uniform deposition on both substrates the gas flow channel should be symmetrical. The location of the junctions should be opposite each other and the level of unevenness of the opposing junctions should be the same.

Referring to FIG. 1A, the gas flow channel extends from one or more gas inlets 140 to one or more gas outlets 142. The one or more gas inlets 140 may be provided in the side wall 112 of the deposition chamber 110 for the ingress of process gases. The number of gas inlets may depend on the dimensions of the substrates to be processed for uniformity of thickness and doping concentration. For example, the number of gas inlets 140 may increase with larger diameter substrates to ensure a uniform flow of process gases. One or more gas outlets 142 may be provided in the side wall 112 for the egress of process gases and by-products. The one or more gas inlets and the one or more gas outlets may be disposed on the side wall 112 so that they are diametrically opposed and they may be aligned with the gas flow channel formed between the front surfaces of the first susceptor assembly 120a and the second susceptor assembly 120b. Each of the one or more gas inlets and each of the one or more gas outlets may be aligned with each other respectively. Each gas inlet provides a stream of process gases that may be individually adjusted. For example, a CVD reactor may have three gas inlets and the stream of process gases provided by each gas inlet may be adjusted differently, including having different concentrations of the process gases, different mean value flow rates, etc. Referring to FIG. 1D, each of the one or more gas inlets may be further partitioned by one or more gas flow dividers 144 to form sub-streams. A plurality of gas outlets may be similarly formed. The number of gas flow dividers of a gas inlet and the number of gas flow dividers of a corresponding gas outlet may be different. The gas flow dividers 144 guide the process gases supplied to the deposition chamber 110 to facilitate the generation of a laminar flow of process gases between the opposing front surfaces 102a and 102b of the substrates 101a and 101b. The number and position of the gas inlets 140 and gas outlets 142 may also depend on the shape of the deposition chamber 110. The deposition chamber 110 shown in FIGS. 1A-1E has a cylindrical body, but it may have a rectangular body or any other shaped body. For example, the number and position of the gas inlets 140 and gas outlets 142 may be adjusted to change the deposition rate at the edge of the front surfaces 102a and 102b.

Referring to FIG. 1C, a loading port 148 may also be provided in the side wall 112 of the deposition chamber 110 for the placement and removal of substrates from the deposition chamber 110. The loading port 148 may be disposed on the side wall 112 between the one or more gas inlets and the one or more gas outlets. The loading port 148 may have a resealable door.

Rotational movements of the susceptors or alternatively of the substrates may be used to distribute the flow of process gases homogeneously over the front surfaces of the substrates. For example, each susceptor assembly may be rotatable so that a received substrate may be rotated about its central axis. In various embodiments, each susceptor assembly may have its own individual and separate rotation mechanism. For example, referring to FIGS. 1A-1C, the shaft 124a which supports the susceptor assembly 120a may be a rotatable shaft. One end of the shaft 124a may be coupled to a rotation mechanism, such as an electric motor with a suitable gear assembly (not shown). The second susceptor assembly 120b may be symmetrically identical to the first susceptor assembly 120a or similarly configured. The opposing susceptor assemblies 120a and 120b should rotate in the same direction at the same rotation rate. The rotation rate may range from about 1 revolution per minute to about 250 revolutions per minute. In various embodiments, the rotation rate may range from about 5 revolutions per minute to about 150 revolutions per minute. The rotational speed should be less than the gas flow rate of each stream to prevent turbulence in the fluid flow. The gas flow rate may depend on chamber geometry and the type of process gas used. Under atmospheric conditions, a typical gas molecule entering the deposition chamber should flow through the gas flow channel in approximately 1 s. In various embodiments, axially aligned susceptor assemblies may be coupled to a single rotation mechanism.

As shown in FIGS. 1A-1C, the pair of susceptor assemblies are mounted in a vertical configuration where the first susceptor assembly 120a is suspended above the second susceptor assembly 120b. In the vertical configuration, the substrates are loaded horizontally. The first and second susceptor assemblies 120a and 120b may be axially aligned. However, other configurations are possible. For example, the CVD reactor may be arranged in a horizontal configuration where the first susceptor assembly 120a and the second susceptor assembly 120b are mounted side-by-side so that the substrates are loaded vertically. FIG. 4C shows the positions of the substrates in a horizontal configuration.

FIGS. 3A-3D show various configurations of susceptor assembly pairs in a CVD reactor according to at least one embodiment. Referring to FIG. 3A, the susceptor assemblies include susceptor platforms 122a and 122b that are configured to receive removably mountable susceptors 121a and 121b. The susceptor platform 122a may be a ring having a rectangular cross-section with an annular ledge 126a protruding radially from the inner surface of the ring. The susceptor platform 122a may be mounted to the susceptor supports 123a with the annular ledge 126a disposed towards the gas flow channel. The susceptor platform 122b may also be a ring having a rectangular cross-section with an annular ledge 126b protruding radially from the inner surface of the ring. The susceptor platform 122b may be mounted to the susceptor supports 123b with the annular ledge 126b disposed away from the gas flow channel. The annular ledges 126a and 126b are configured to support a corresponding susceptor.

The susceptor 121a may be a disk with an annular ledge 128a protruding radially from the outer edge of the disk. The ledge 128a of the susceptor 121a should be configured to rest on the ledge 126a of the susceptor platform 122a so that the front surfaces of the susceptor platform 122a and the susceptor 121a are aligned to be flush with each other and there is little or no gap between them. The susceptor 121b may be a disk. The susceptor 121b should be configured to rest on the ledge 126b of the susceptor platform 122b so that the front surfaces of the susceptor platform 122b and the susceptor 121b are aligned to be flush with each other and there is little or no gap between them. The susceptors should be mounted on the susceptor platforms to minimize the leakage of process gases from the gas flow channel.

The susceptor 121a includes a recess on the front surface for housing a substrate 101a. The recess may extend through the susceptor 121a forming a hole in the center of the susceptor. The susceptor 121b includes a recess on the front surface for housing a substrate 101b. The recess may extend through the susceptor 121b forming a hole in the center of the susceptor. The dimensions of the recess may depend on the dimensions of the substrate being accommodated by the susceptor. The substrates 101a and 101b should be tightly coupled to the susceptors 121a and 121b, respectively, to minimize the interaction between the process gases and the back surface 103a, 103b of the substrate 101a, 101b. There should be little or no gap between the edges of the substrates 101a and 101b and the edges of the recess of the susceptors 121a and 121b to prevent the leakage of process gases out of the gas flow channel. The substrates should also be coupled to the susceptors to prevent slipping of the substrate into the recess since any change in the planar alignment of the substrate in the gas flow channel would result in a temperature gradient. The edges of the substrates may be coupled to the edges of the front surface of the substrates by mechanical fasteners such as pins, clips, and tabs, to name a few. The substrates may also be held in place by vacuum-based fasteners such as vacuum cups positioned near the edges of the substrates on the back surface.

Figure 3B:
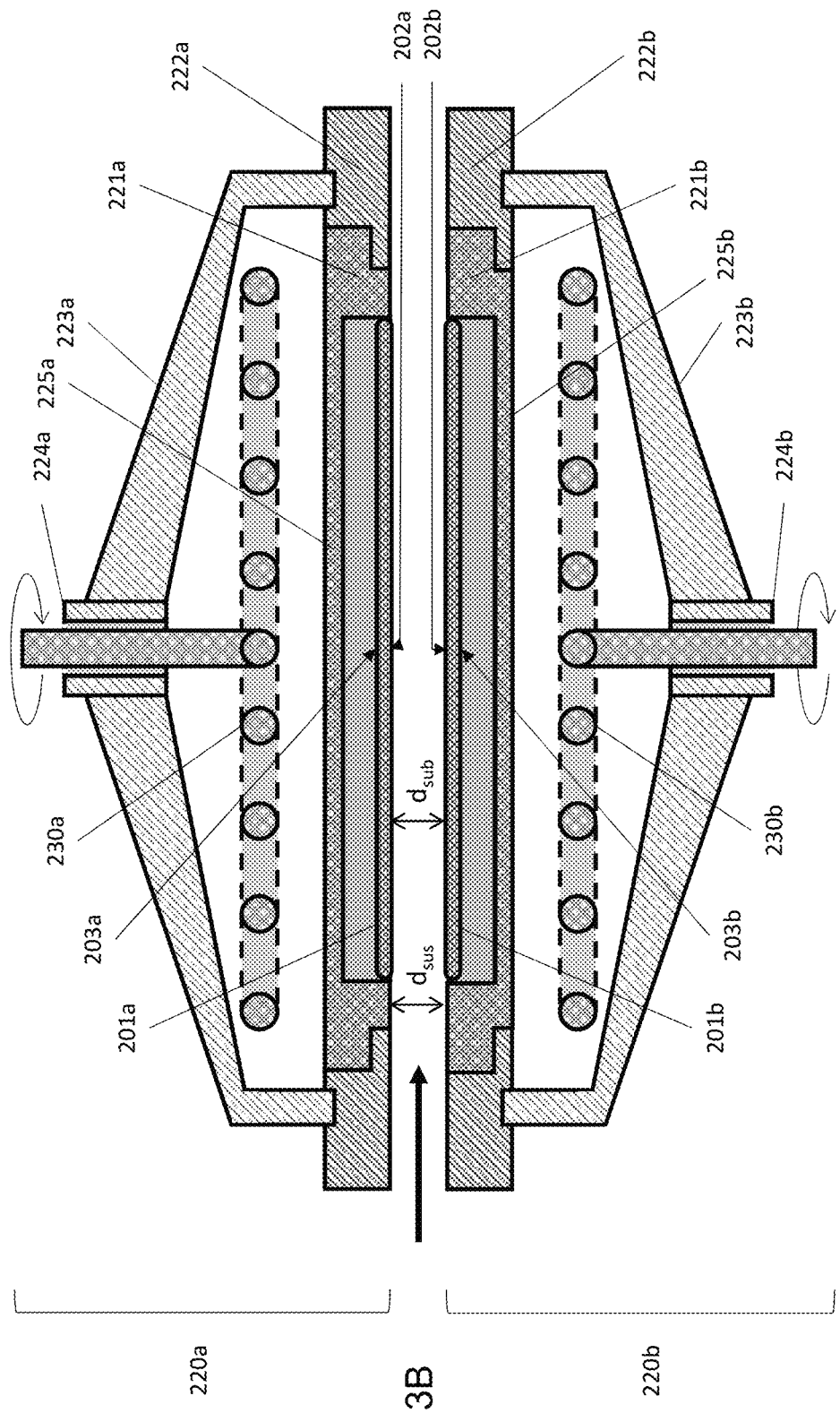
Figure 3D:
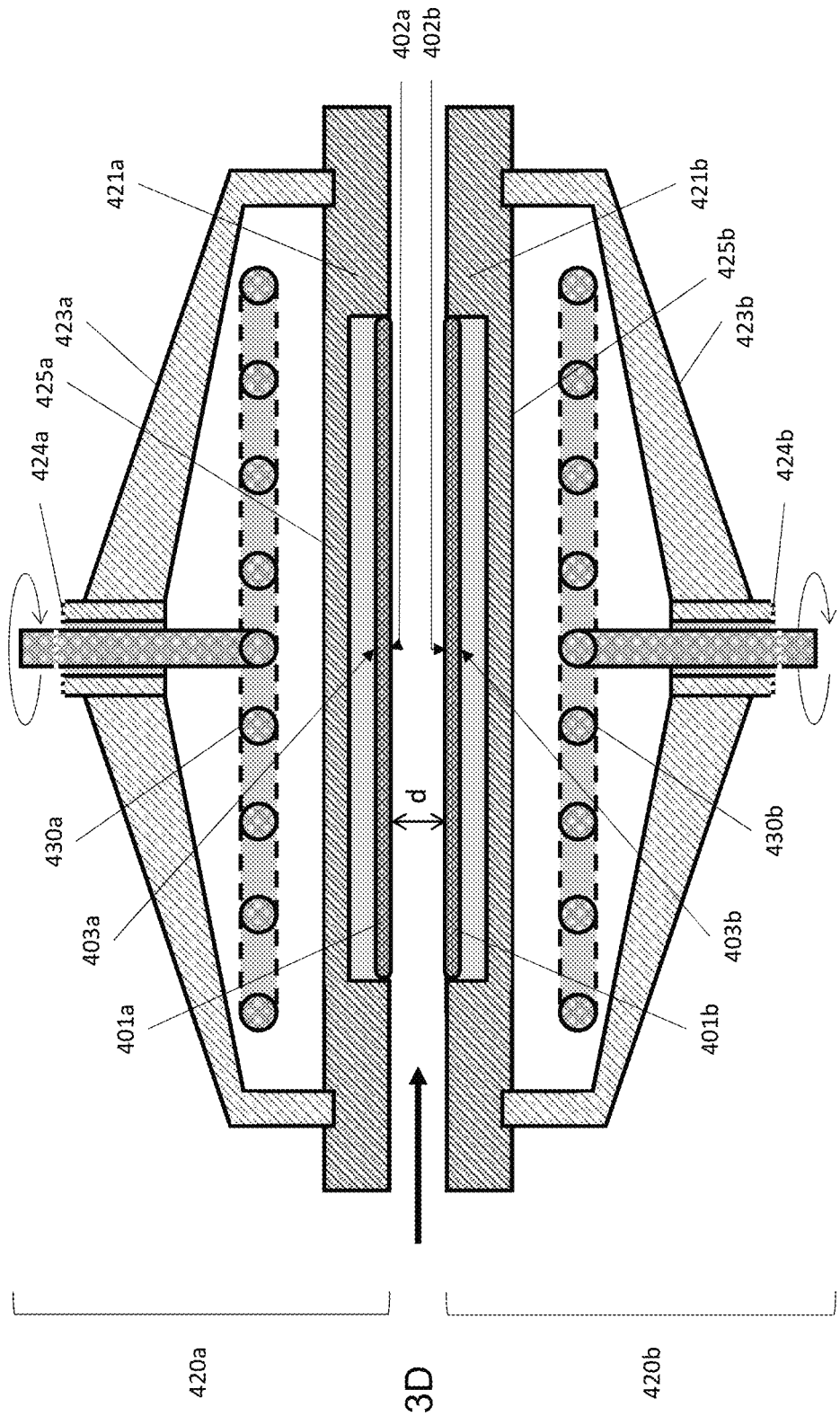

The susceptor assemblies shown in FIGS. 3B-3D are similar to the susceptor assembly shown in FIG. 3A except for the differences described below.

Referring to FIG. 3B, the susceptor assemblies include a susceptor 221a and 221b that each have a recess on its front surface for housing a substrate. The recesses do not extend through the respective susceptors. A portion of each of the susceptors 225a and 225b forms a rear wall of the respective recess. The depth of the recess should be deep enough so that thermally induced distortions of the susceptors 221a and 221b caused by high process temperatures does not result in the susceptor coming into contact with the back surfaces 203a and 203b of the substrates 201a and 201b.

Referring to FIG. 3C, the susceptor assemblies include susceptors 321a and 321b that are coupled directly to susceptor supports 323a and 323b, respectively. The susceptors 321a and 321b may be removably mountable.

Referring to FIG. 3D, the susceptor assemblies include susceptors 421a and 421b that are coupled directly to susceptor supports 423a and 423b, respectively. The susceptors 421*a* and 421*b* may be removably mountable. The susceptors 421*a* and 421*b* each include a recess having a back wall formed by a portion of the back surface 425*a* and 425*b* of the respective susceptor.

Although FIGS. 3A, 3B, and 3D show side walls of the recesses of the susceptors to be vertical, the side walls may be sloped or partially sloped as shown in FIG. 3C. Wafer substrates are manufactured by a process that may produce wafer substrates having the same thickness but slightly different diameters. For example, the actual diameter of a 300 mm diameter wafer substrate may vary by up to ±100 µm. In order to optimize uniformity of the gas flow path (i.e., maintain the opposing front surfaces of the wafers at the same height relative to the respective front surfaces of the susceptors), wafer substrates having the same diameters may be selected to be mounted opposite each other. Alternatively, a susceptor may have a recess with side walls that are sloped to accommodate substrates having different diameters. The sloped side walls may include multiple concentric rings of miniature mechanical fasteners around the side walls near the rim of the recess. For example, each ring may include a plurality of springs or clips that will radially fasten the wafer substrate to the same height in a susceptor independent of the wafer diameter. For example, FIG. 3C shows susceptors having recesses with side walls that are partially sloped. The slope of the side walls of the recesses may depend on the geometry of the wafer substrate edges.

In various embodiments, the CVD reactor 100 may also have heating elements in the deposition chamber 110. The heating elements 130*a* and 130*b* may be resistive heating elements or inductive heating elements. The heating elements 130*a* and 130*b* may be arranged in a plane parallel to the back surface of the susceptor 121*a* and 121*b*. Each of the heating elements 130*a* and 130*b* may include one or more segments uniformly distributed in a radial manner from around the center of the substrate and to the edge of the substrate. The one or more segments may be concentric. The heating of each segment may be individually controlled to minimize radial temperature gradients. The temperature gradients can also be optimized by using heating elements that have a local change in distance relative to the plane of the wafer substrate. For example, the one or more segments of the heating elements may be disposed on planes at different distances from the plane of the wafer substrate. The one or more segments may be overlapping. The one or more segments of the heating elements may have a conical shape.

The heating elements 130*a* and 130*b* may heat the wafer substrate directly or indirectly using inductive plates disposed near the wafer substrate. When inductive heating elements are used, the heating induced in the inductive plates depend on the frequency or frequencies of the inductive heating elements. Referring to FIGS. 3A and 3C, an inductive plate 132*a* (132*b*, 332*a*, 332*b*) may be disposed between the back surface 103*a* (103*b*, 303*a*, 303*b*) of a substrate 101*a* (101*b*, 301*a*, 301*b*) and the inductive heating element 130*a* (130*b*, 330*a*, 330*b*) within the space delineated by the susceptor supports 123*a* (123*b*, 323*a*, 323*b*). The inductive plate may also be disposed behind the inductive heating element. A susceptor may be configured to be used as an inductive plate. For example, referring to FIGS. 3B and 3D, a portion of the graphite susceptor 225*a*, 225*b*, 425*a*, 425*b* that forms a rear wall of a respective recess may be used as an inductive plate.

Although FIGS. 3A-3D show various configurations of susceptor assembly pairs including inductive coils and inductive plates or susceptors, similar configurations of susceptor assembly pairs without the inductive coils and inductive plates or susceptors may be used depending on the temperature control system.

Figure 4B:
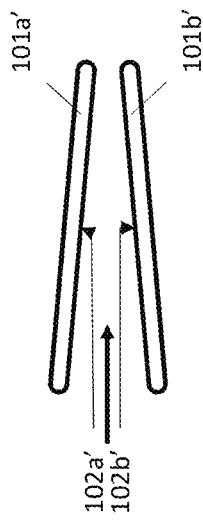
FIGS. 4A-4D show various arrangements of susceptor assemblies of a CVD reactor according to at least one embodiment.
Figure 4D:
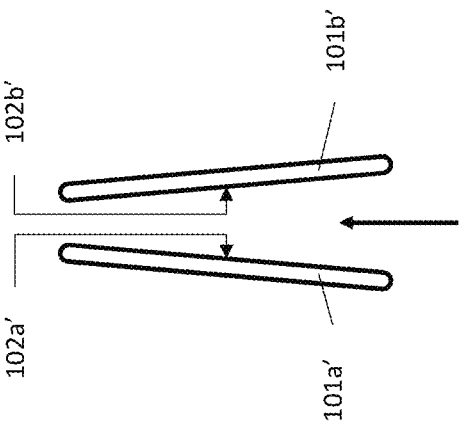
Figure 4A:
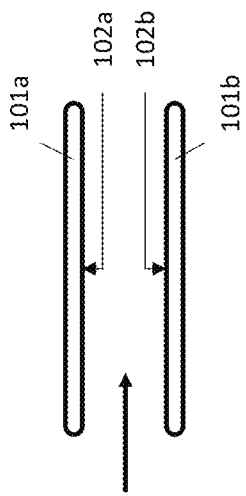
Figure 4C:
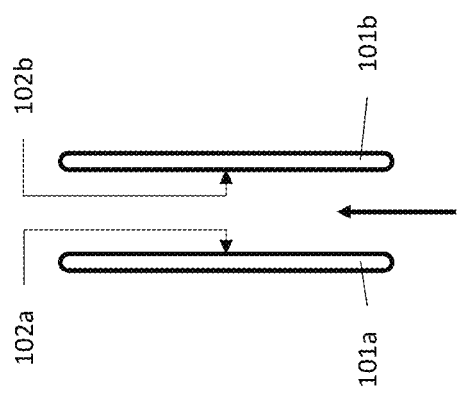

FIGS. 4A-4D show various arrangements of susceptor assemblies of a CVD reactor according to at least one embodiment. FIGS. 4A and 4B show arrangements of susceptor assemblies that have been mounted to have a horizontal gas flow channel. FIGS. 4C and 4D show arrangements of susceptor assemblies that have been mounted to have a vertical gas flow channel. Referring to FIGS. 4A and 4C, the front surfaces 102*a* and 102*b* of the substrates 101*a* and 101*b* may be parallel with each other. The arrow indicates the direction of gas flow. As the process gas flows from one or more gas inlets to one or more gas outlets between the two front surfaces 102*a* and 102*b* of the substrates 101*a* and 101*b*, the deposition and dopant molecules in the process gas diffuse into the two front surfaces 102*a* and 102*b*. Deposition and doping molecules are gradually depleted due to diffusion to the wafer surfaces as the process gas proceeds further along the gas flow channel. The reduction in concentration of deposition and dopant molecules in the process gas may reduce the uniformity of thickness and doping concentration. One way to increase the local concentration of deposition and dopant molecules is to reduce the size of the gas flow channel as the process gas flows from the least one gas inlet 140 to the at least one gas outlet 142. Thus, to improve the uniformity of the thickness and the doping, the susceptor assemblies 120*a* and 120*b* may be configured so that the front surfaces 102*a* and 102*b* of the substrates 101*a* and 101*b* may be inclined towards each other so that the distance $d_{sub}$ between the opposing substrate surfaces near the at least one gas inlet 140 is greater than the distance $d_{sub}$ between the opposing substrate surfaces near the at least one gas outlet 142. Referring to FIGS. 4B and 4D, the surfaces 102*a*' and 102*b*' may be inclined so that the gas flow channel gradually narrows as the process gases are transported from the one or more gas inlets 140 towards the one or more gas outlets 142. The inclination angle may be dependent on the gas flow rate and the deposition rate. The deposition rate may be dependent on (silicon gas concentration, dopant gas concentration, carrier gas, process temperature, and process pressure). Although FIGS. 4C and 4D indicate a gas flow direction from the bottom of the deposition chamber to the top of the deposition chamber, it may be reversed. The one or more gas inlets should be disposed near the wider portion of the gas flow channel.

The process temperature is an important parameter in the deposition reaction. An accurate process temperature measurement may be used to control the deposition reaction. The temperature on the back surface and the front surface of each of the substrates should be identical or nearly identical. Temperature sensors may be mounted near the center of the back surface of each substrate or susceptor to measure the process temperature. In response to the temperature readings, the temperature control system should be controlled to minimize any temperature gradient between the two substrates. To minimize the radial temperature gradients of each substrate, additional temperature sensors may be mounted near the back surface of each substrate along the substrate edge or recess edge. These temperature readings may be used to configure and optimize the thermal output of the radial heaters. In various embodiments, the temperature sensor may be a pyrometer. In various embodiments, temperature sensors may be mounted in other locations.

To control the process temperature, the CVD reactor 100 may include a temperature control system having one or more types of heating elements. Examples of heating elements include: lamp heaters, resistive heaters, inductive heaters, infrared heaters, and microwave heaters, to name few. A CVD reactor may include a combination of rapid and slow heating elements. The different types of heating elements may be operated together simultaneously or sequentially. The heating elements may be used to adjust the temperature of the walls of the deposition chamber, the substrates, the susceptor assemblies, and the process gases.

Referring to FIGS. 1F-1H, the CVD reactor 100 may be configured as a variable warm/hot wall type reactor depending on the type of process gas. It may include two temperature control chambers 115a and 115b coupled to the deposition chamber 110 so that deposition chamber 110 is surrounded by the two temperature control chambers 115a and 115b. The first end wall 111a of the deposition chamber 110 forms a wall of the temperature control chamber 115a and the second end wall 111b of the deposition chamber 110 forms a wall of the temperature control chamber 115b. Each of the temperature control chambers 115a, 115b may be chamber further having a side wall 116a, 116b and end wall 117a, 117b, respectively. The side walls and end walls may be formed from aluminum. The chambers may be cylindrically-shaped, rectangular shaped, or any other shape. The temperature control chambers 115a and 115b may be used to manage the temperature at the substrates 101a and 101b and at the first and second end walls 111a and 111b.

According to various embodiments, the CVD reactor may include one or more types of heating elements. The heating elements may be disposed in the deposition chamber, in the temperature control chambers, around the wall of the deposition chamber, over an end wall of the temperature control chamber, or a combination of these locations. The temperature control chambers 115a and 115b may contain one or more heating elements. For example, referring to FIGS. 1A-1H, each of the temperature control chambers 115a and 115b may include an array of lamp heating elements 135a and 135b. The array of lamp heating elements may be an array of halogen lamps or infrared lamps.

FIGS. 2A-2I shows various configurations of heating elements of a CVD reactor according to at least one embodiment. The various positional configurations of heating elements described with respect to FIGS. 2A-2I may be applied to any of the configurations of a susceptor assembly pairs described herein. Referring to FIGS. 2A-2I, the heating elements in the second susceptor assembly 1020b may be symmetrically identical to the first susceptor assembly 1020a or similarly configured.

Figure 2A:
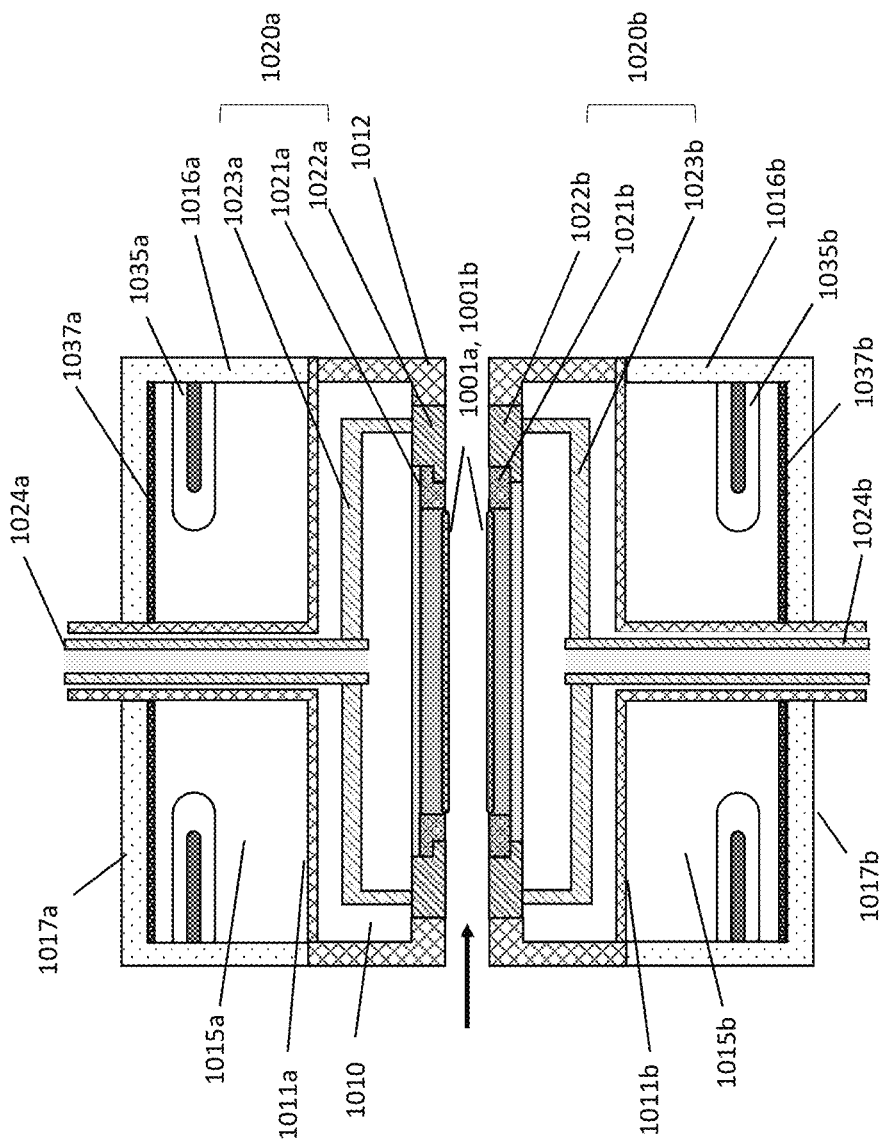
FIGS. 2A-2I shows various configurations of heating elements of a CVD reactor according to at least one embodiment.

FIG. 2A shows a CVD reactor including a temperature control chamber 1015a containing one or more lamp heating elements 1035a. The one or more lamp heating elements may be halogen lamps or infrared lamps. Referring to FIG. 2A, one or more openings may be provided on the side wall 1016a of the temperature control chamber 1015a. The one or more openings may be uniformly distributed radially around the circumference of the temperature control chamber 1015a. The one or more openings may be fitted with lamp heating elements 1035a. The temperature control chamber 1015a may contain a circular array of lamp heating elements 1035a. A heat reflector 1037a may be disposed on the end wall 1017a of the temperature control chamber 1015a to reflect the heat energy radiating towards the end wall 1017a from the lamp heating elements 1035a back towards the substrate 1001a. The heat reflector 1037a may be a thin layer of metal such as gold, silver, or aluminum. For example, it may be a layer of gold that is about 100 µm thick. The heat reflector 1037a may also be a thin layer of ceramic.

The one or more lamp heating elements 1035a may be replaced with one or more infrared heating elements. The end wall 1011a shared by the deposition chamber 1010 and the temperature control chamber 1015a should be made of a transparent material, for example, quartz, to allow light rays to reach the substrate or the inductive plate. The temperature control chamber 1015b is symmetrically identical to the temperature control chamber 1015a or similarly configured.

FIGS. 2B-2E show CVD reactors including one or more heating elements disposed in various positions. For example, the one or more heating elements may be resistive heating elements or inductive heating elements. In various embodiments, the one or more inductive heating elements 1030a may be a flat spiral copper coil induction heater of the same or similar diameter as the substrate 1001a. The spacing between each winding of an inductive heating element may be uniform or it may be varied. The diameter of each inductive heating element may be varied. The one or more inductive heating elements 1030a are not limited to a flat plane. To improve the temperature gradients, the vertical distance between each winding of an inductive heating element 1030a and the back surface 1003a of a substrate 1001a may be different. For example, an inductive heating element may have a conical shape or alternating windings of the inductive coil may be in a first plane and a second plane. Each inductive heating element may be on its own plane. The inductive heating element may have a circular shape, a rectangular shape, or any other shape. The one or more inductive heating elements may operate at different frequencies.

Further, an opening that may be provided in the end wall 1011a shared by the deposition chamber 1010 and the temperature control chamber 1015a for a rotatable shaft 1024a supporting the susceptor assembly 1020a may lower the temperature near the center of the substrate 1001a. A second inductive heating element may be installed near the shaft 1024a to compensate for the additional temperature reduction. The second inductive heating element may provide more heat than the first inductive heating element. Accordingly, it may have a higher density of winding than a first inductive heating element and/or a separate heating controller to be operated at a different frequency. The second inductive heating element may be coextensive with the first inductive heating element, partially overlap with the first inductive heating element, or have not overlap with the first inductive heating element. The second inductive heating element may be concentric with the first inductive heating element. The second inductive heating element may be on a different plane than the first inductive heating element.

When inductive heating elements are used, an inductive plate is also required because inductive heating elements cannot radiate heat directly to the wafer substrates. For example, such an inductive plate may be a graphite plate disposed near a wafer substrate. For example, the distance between the inductive plate and the wafer substrates may be in the range from about 1 cm to about 20 cm. The distance may depend on the frequency of the one or more inductive heating elements. For example, the distance may be about 1 cm for a low frequency (e.g., 10 kHz-100 Mhz) inductive heating element. For example, the distance may range from about 5 cm to about 10 cm for a high frequency (e.g., 300 Mhz-300 GHz) inductive element. In general, lower frequency inductive heating elements may provide better temperature uniformity. The thickness of the graphite plate may also depend on the frequency of the one or more inductive heating elements. The inductive heating elements may operate on the inductive plate at various distances. For example, the distance between an inductive heating element and an inductive plate may be in the range from about 1 to about 3 cm. The effectiveness reduces with increasing distance. The one or more inductive heating element should induce from about 30 kW to about 50 kW of energy to heat a wafer substrate to about 1100° C.

Figure 2B:
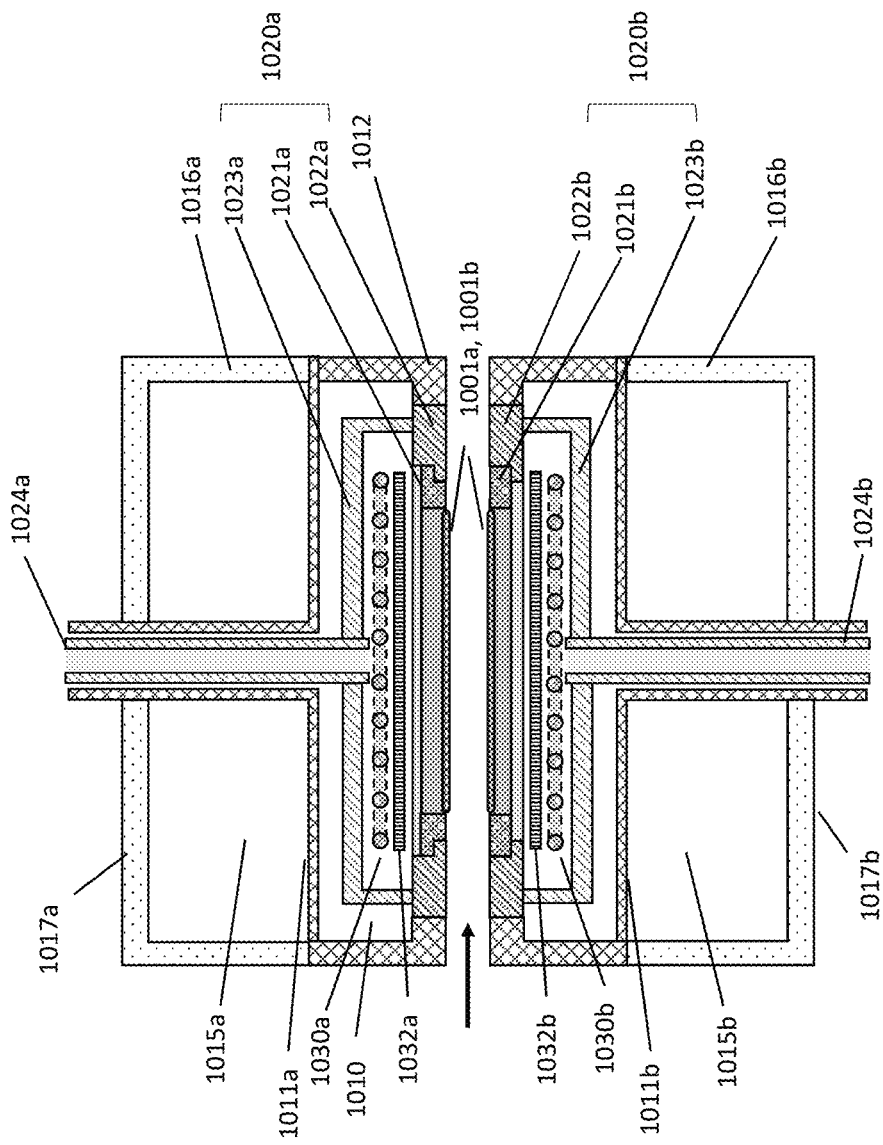
Figure 2C:
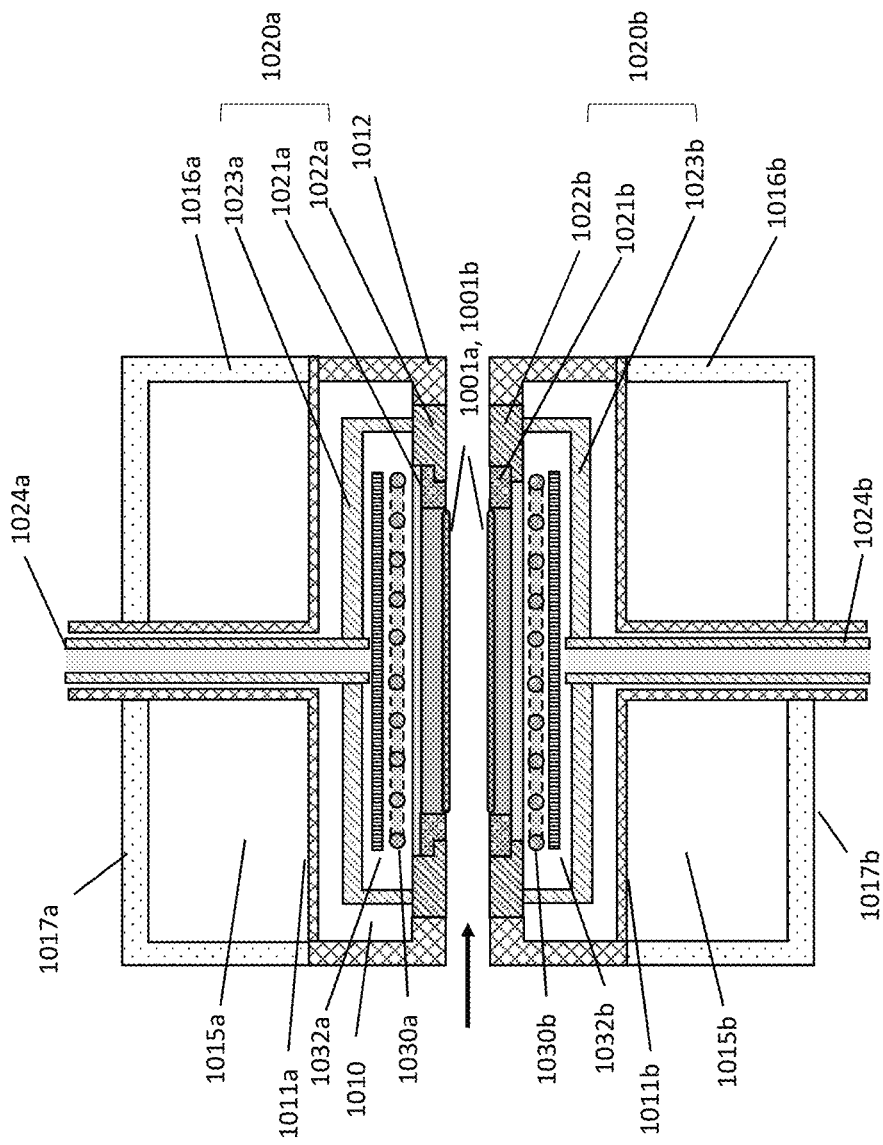

FIGS. 2B and 2C show one or more inductive heating elements disposed in a deposition chamber of a CVD reactor. The inductive heating elements 1030a may be positioned to be disposed over the back surface of a substrate when it is mounted in a susceptor assembly. The shaft supporting the susceptor assembly may be hollow and serve as a conduit for wiring. Referring to FIGS. 2B-2C, one end of a spiral coil induction heater may be a wire that extends from the center of the spiral coil through the hollow center of the shaft 1024a to be connected to a heating controller (not shown). The one or more inductive heating elements 1030a may be positioned in the space between the susceptor 1021a and the susceptor supports 1023a so that they are disposed over a back surface 1003a of a mounted substrate 1001a. The one or more inductive heating elements 1030a may be arranged in a plane parallel to the back surface 1003a of the substrate 1001a and may extend from the center of the substrate 1001a to at least the edge of the substrate 1001a. An inductive plate 1032a may be disposed between the substrate 1001a and the inductive heating elements 1030a or may be disposed between the inductive heating elements 1030a and end of the shaft 1024a.

When an inductive heating element is disposed in the deposition chamber, the coils of the inductive heating element should be covered with a coating that prevents the metal in the coils from reacting with any leaked gases escaping from the gas flow channel. The coating should also prevent the diffusion of any metal through the coating material at high temperatures. For example, the coating material may include polysilicon carbide, quartz, graphite, or a ceramic. The coating may be a single layer of one of the coating material or multiple layers of one or more of the coating material. The coating material may also be a composite. If the coating fails, contamination may occur.

Figure 2D:
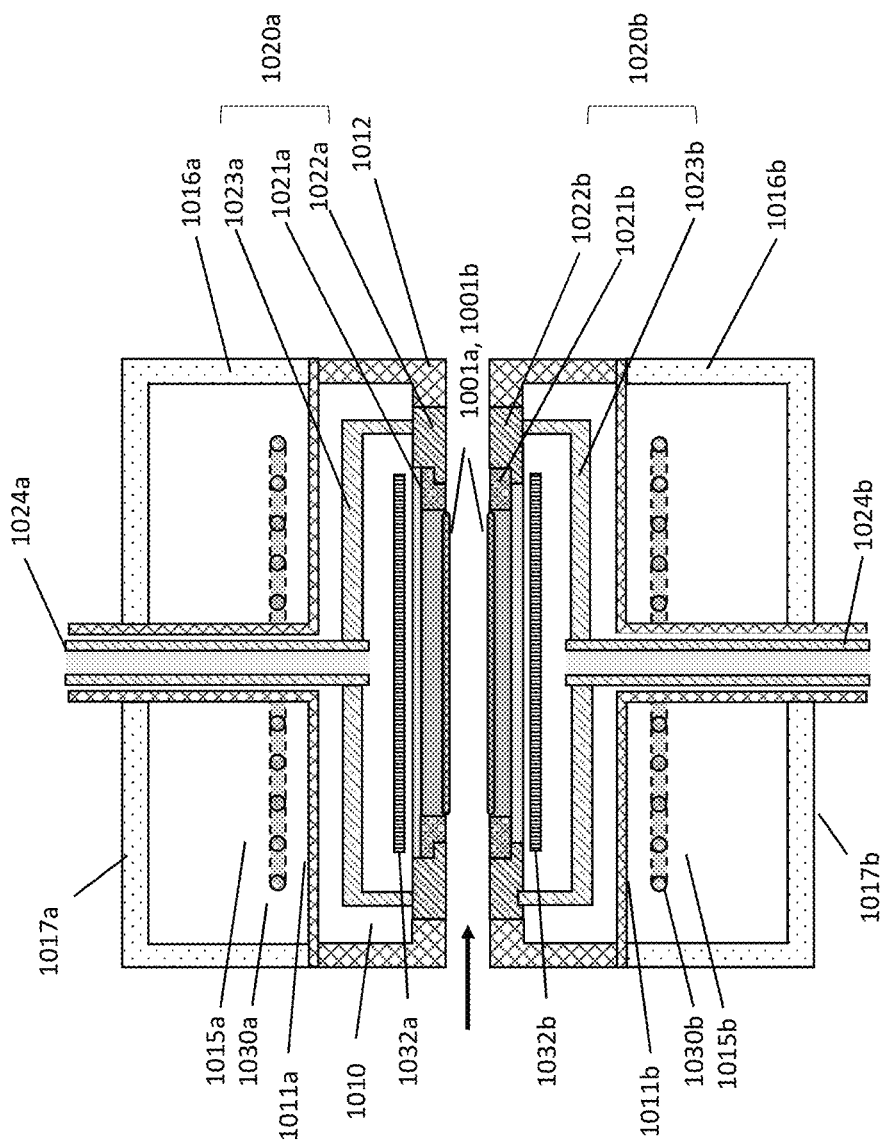

FIG. 2D shows one or more inductive heating elements disposed in a temperature control chamber of a CVD reactor. The one or more inductive heating elements 1030a are disposed over the back surface of the substrate 1001a outside of the deposition chamber 1010 so no protective coating would be required. In this configuration, the one or more inductive heating elements 1030a (e.g., one or more inductive coils) are further away from the inductive plate 1032a, but there is no risk of contamination due to failure of the protective coating.

Figure 2E:
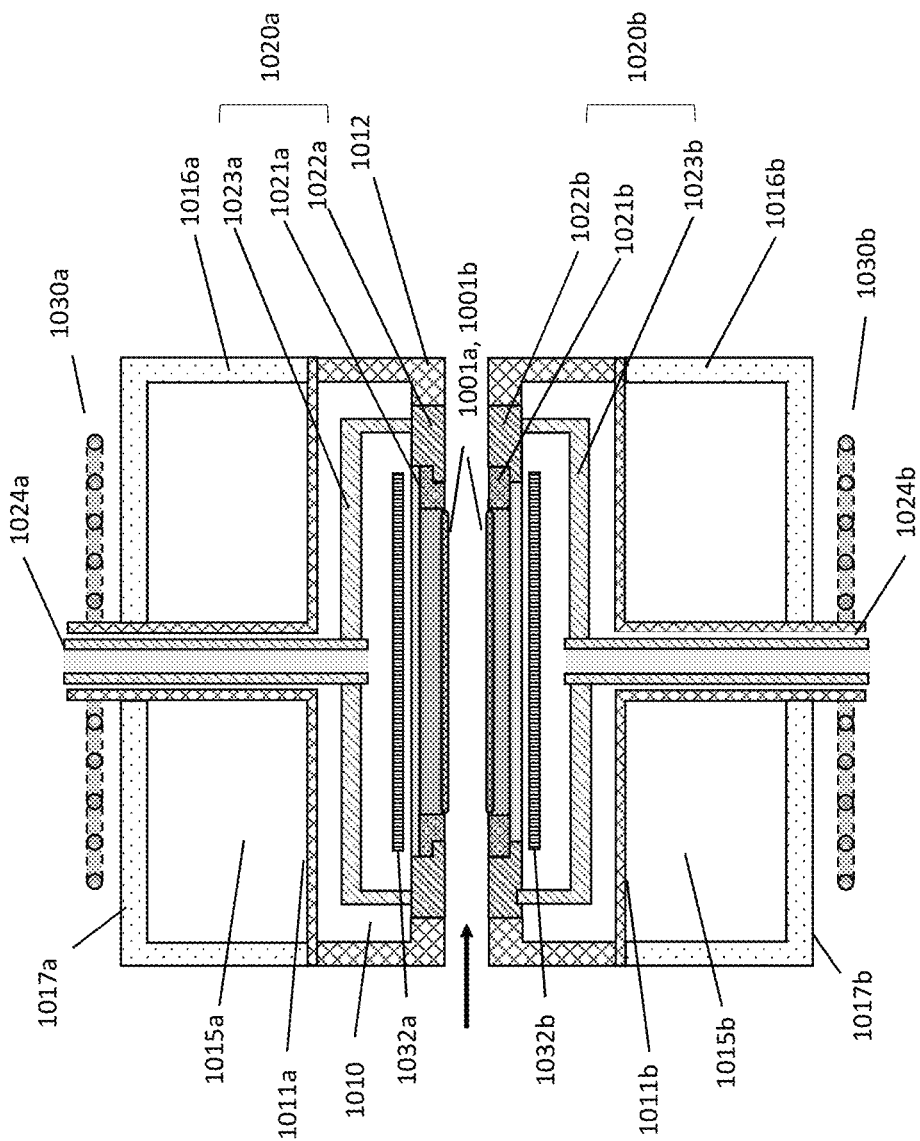
Figure 2F:
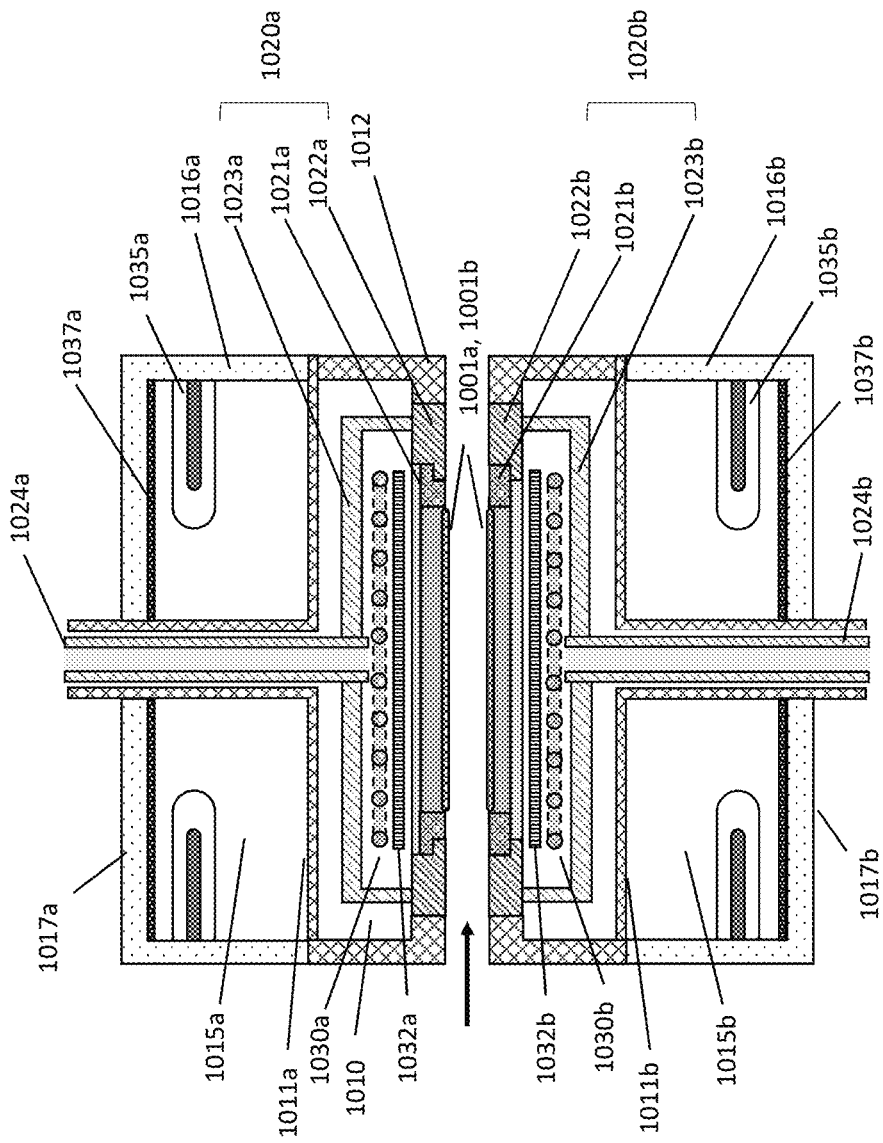
Figure 2G:
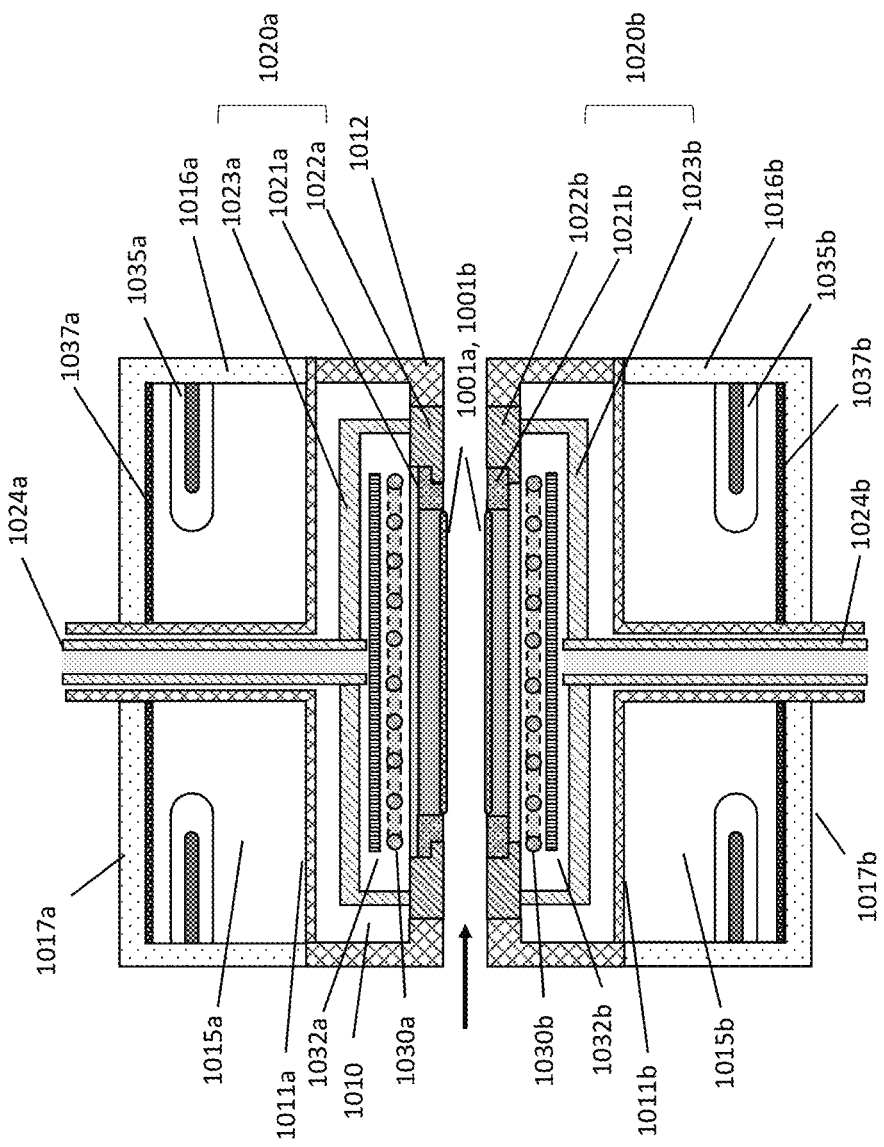
Figure 2H:
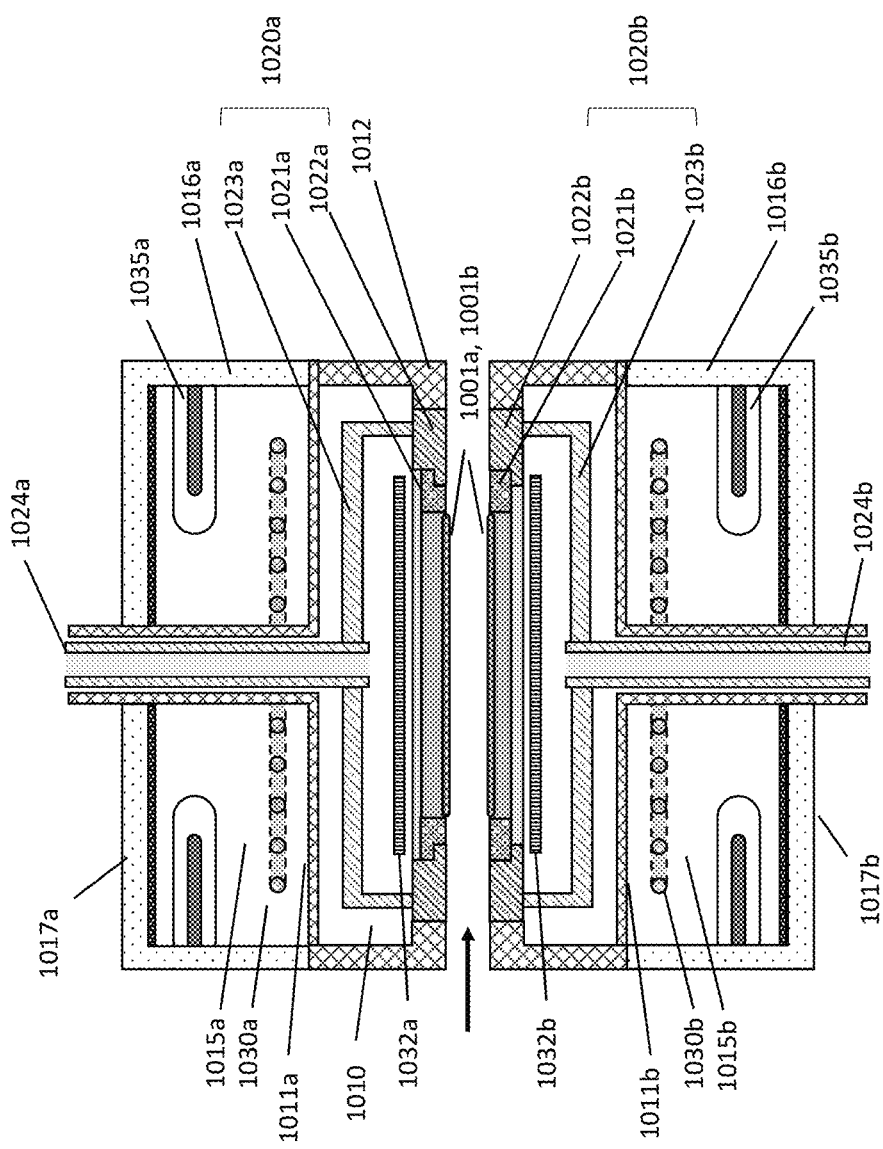

FIG. 2E shows one or more inductive heating elements disposed outside of the temperature control chamber and the deposition chamber of a CVD reactor. The one or more inductive heating elements 1030a are disposed over the back surface of the end wall 1017a of the temperature control chamber 1015a. In this configuration, the one or more inductive heating elements 1030a (e.g., one or more inductive coils) are further away from the inductive plate 1032a, but there is no risk of contamination due to failure of the protective coating.

FIGS. 2F-2I show various configurations of a temperature control system including one or more lamp heating elements 1035a and one or more inductive heating elements 1030a. The lamp heating elements and inductive heating elements may be used sequentially. For example, for deposition on silicon substrates, the lamp heating elements may be used to rapidly heat the deposition chamber to about 950° C. and the inductive heating elements may be used to gradually heat the deposition chamber to about 1050° C. and maintain the temperature. The lamp heating elements and inductive elements may be used simultaneously. For example, the lamp heating elements and the inductive heating elements may be used to initially heat the deposition chamber. The one or more inductive heating elements may be configured to operate at different frequencies to provide different levels of heating. The one or more inductive heating elements may be configured to operate at different heights above a respective substrate to provide different levels of heating. Some positional combinations of these heating elements may require adjustments. For example, referring to FIGS. 2F and 2H, when one or more lamp heating elements and one or more inductive heating elements (e.g., copper line inductors) are used in combination, such that the one or more inductive heating elements are disposed between the inductive plate and the one more lamp heating elements, the one or more lamp heating elements may produce uneven heating of the wafer substrate. For example, the one or more lamp heating elements 1035a may heat up the copper lines of one or more inductive heating elements 1030a and/or the one or more lamp heating elements 1035a may also cause shadow effects on the inductive plate 1032a. One way to minimize the shadow effect on the inductive plate 1032a and heating of the inductor coils of the one or more inductive heating elements 1030a is to add a coating of gold or other reflective metal on the inductor coil and optimize the distances between the one or more lamp heating elements 1035a and one or more inductive heating elements 1030a and between the one or more inductive heating elements 1030a and the wafer substrate 1001a. The optimized distance and reflective coating reduce heat build up and create diffused reflections of the lamp rays to cast softer shadows to mitigate shadow effects. The gold coating may be included under the protective coating. For example, referring to FIG. 2H, the one or more inductive heating element 1030a may be disposed outside of the deposition chamber 1010. In this configuration, no protective coating is needed for the one or more inductive heating elements 1030a. However, due to the shorter distance between the one or more inductive heating elements 1030a and the one or more lamp heating elements 1035a, it may be difficult to optimize the distance to reduce the heat up effect therefore a cooling system for the coils of the one or more inductive heating elements 1030a may be added. The cooling system may for example be a sprinkler system.

Another way to eliminate the shadow effect may be to position the inductive plate to be disposed between the one or more inductive heating elements and the one or more lamp heating elements. For example, referring to FIG. 2G, the inductive plate 1032a may be disposed behind the one or more inductive heating elements 1030a. In this configuration, the inductive plate 1032a may still heat up the inductor coils and cause uneven heating of the substrate and there is still a risk of failure of the protective coating when the inductor coil is in the deposition chamber.

Figure 2I:
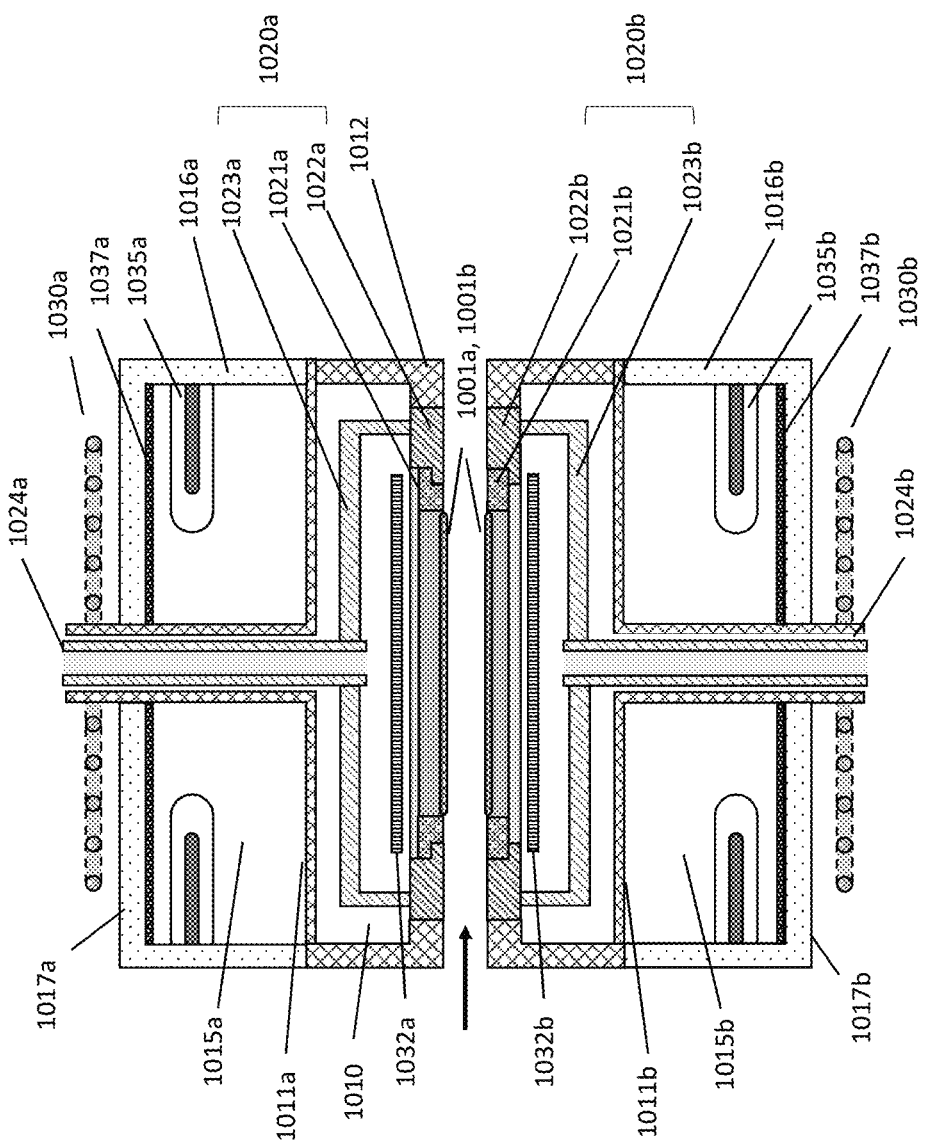

Referring to FIG. 2I, in this configuration, the one or more inductive heating elements 1030a (e.g. spiral copper elements) are disposed over the back surface of the end wall 1017a which eliminates both the shadow effect and the heat up effect. However, the one or more inductive heating elements 1030a may heat up the heat reflector 1037a and the end wall 1017a. In various embodiments, a water-based cooling system may be provided to cool the end wall.

In various embodiments, resistive heating elements have may similar coatings.

In various embodiments, one or more microwave heating elements 1033 (not shown) may also be used. For example, the one or more microwave heating elements may include one or more microwave emitters mounted outside of the deposition chamber and configured to emit microwaves into the deposition chamber. For example, a first set of one or more microwave emitters may be directed to a first substrate and a second set of one or more microwave emitters may directed to a second substrate. Any well-known and suitable microwave emitter may be used. The one or more microwave heating elements 1033 may be used alone or in combination with the one or more lamp heating elements, the one or more resistive heating elements, and/or the one or more inductive heating elements.

When one or more microwave heating elements and one or more inductive heating elements are used in combination, the one or more inductive heating elements should be outside of the space targeted by the microwaves. The one or more microwave heating elements may be used initially to rapidly heat up the wafer substrate and the one or more inductive heating elements may be used subsequently to uniformly distribute and maintain the heat.

The substrates may be susceptible to variable temperature gradients in a vertical direction between the front surface and the back surface of the substrate and in a radial direction between the center and edges of the substrate. In various embodiments, to reduce the vertical and radial gradients to optimize thickness and doping concentration, a susceptor should be made with a material that has similar heat conduction and emissivity characteristics as the substrate. Additionally, the temperature gradients may be further smoothed by using inductive heating elements or a combination of heating elements including inductive heating elements.

The heating elements should be configured and controlled to minimize the vertical and radial temperature differences in the substrate. For example, for a substrate having a thickness in the range from about 0.4 mm to about 1.2 mm and a radius in the range from about 5 cm to about 30 cm, the vertical temperature difference (i.e., the difference in temperature between a front surface and a back surface of a substrate) should be less than about 2° C. and the radial temperature difference (i.e., the difference in temperature between the center of the substrate and the edge of the substrate) should be less than about 5° C.

Since the gas flow channel is between two substrates that are heated, the temperature gradient of the process gas in the gas flow channel is also minimized. Because each of the opposing substrates are symmetrically heated, they may also both serve as heaters for each other that maintain the temperature of the process gas at process temperature as it flows along the gas flow channel.

To improve the uniformity of the thickness and uniformity of the doping, the CVD reactor may include a process gas pre-heater. The process gases may be pre-heated in order to avoid a high temperature gradient with the heated gases in the deposition chamber which would allow the chemical reactions to occur more homogeneously in the gas flow region.

The walls of the deposition chamber may be made of a material that is easy to clean. For example, the walls may be formed from a transparent, insulating material, such as quartz, which is inert with respect to the process gases and reaction by-products. When halogen lamp heating is used, the walls of the deposition chamber should be transparent quartz. However, for inductive or microwave heating, the walls of the deposition chamber may be, for example, made of ceramic material. Ceramic material can have less heat conduction compared to quartz, and therefore the temperature gradient between the substrate and the deposition chamber wall may be reduced without heating up the walls of the deposition chamber. This would reduce the buildup of by-products deposited on the walls of the deposition chamber.

Alternatively, the side wall and the end walls of the deposition chamber can be made from different material. For example, the side wall can be made from a thermally isolating or insulating material such as glass-foam and the end walls of the deposition chamber can be made from thermally conductive material such as quartz glass to transmit radiation from the heating elements. This may lead to a more homogeneous temperature distribution on the substrate, at least when the heating is applied from outside the deposition chamber.

The wafer substrate may be made from a variety of semiconductor material including for example, silicon (Si), silicon carbide (SiC), gallium nitride (GaN), and gallium arsenide (GaAs). In various embodiments, the wafer substrate may be made of silicon carbide. When silicon carbide is used as the semiconductor material, lamp heating elements should not be used. Microwave heaters or inductive heaters or a combination of the two may be used. Due to the higher process temperature for silicon carbide, the end walls of the deposition chamber may be made of ceramic. Alternatively, a cooling system, for example, such as a sprinkler system may be used to cool end walls made of quartz.

The susceptors 121*a* and 121*b* should be made from material that is thermally conductive and resistant to distortion at CVD process temperatures which may be in the range from about 600° C. to about 1300° C., e.g., for Si epitaxy, or up to 1700° C., e.g. for SiC epitaxy. For example, the susceptors 121*a* and 121*b* may be formed from a ceramic material, such as aluminum nitride (AlN). The susceptor may also be made from graphite and coated with silicon carbide or glassy carbon, or it may be made completely of only SiC, because Si and C will not cause any doping contamination in the epitaxial layers. The coating can reduce the temperature gradient on the surface of the susceptor. In various embodiments, a pure polycrystalline silicon carbide coating is used. In addition to minimizing the surface temperature gradient of a susceptor, the coating may also facilitate heat distribution between the susceptor and the substrate so that thermal tensions between the different materials may thereby be avoided.

Figure 6B:
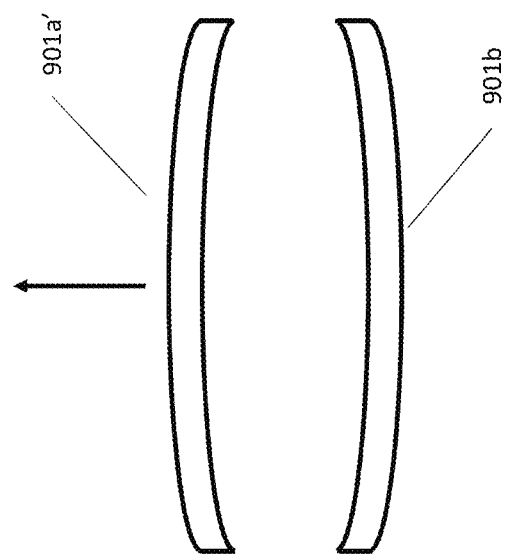
FIG. 6A shows a configuration of a CVD reactor that illustrates substrate bowing and FIG. 6B shows a configuration of a CVD reactor that illustrates how substrate bowing may be corrected according to at least one embodiment.
Figure 6A:
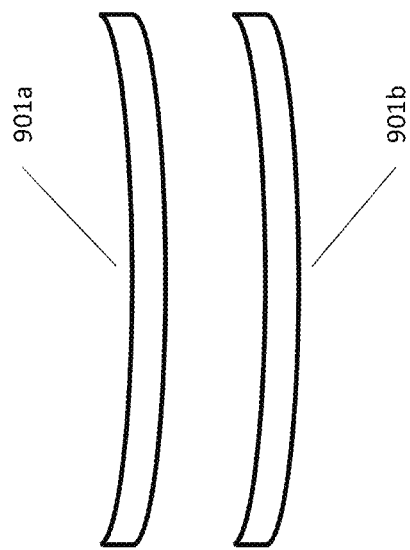

Wafer substrates having larger diameters are susceptible to large bows in the range from about 20 µm to about 30 µm at high process temperatures. While the distance between the two bowing wafer substrates along the gas flow channel should be very similar because of the geometrical symmetry and same process conditions, the gas flow channel along the wafer substrates will not be exactly horizontal. FIG. 6A shows a configuration of a CVD reactor that illustrates substrate bowing and FIG. 6B shows a configuration of a CVD reactor that illustrates how substrate bowing may be corrected according to at least one embodiment. As shown in FIG. 6A, the gas flow channel has a slight curve from the edges to the centers of the wafer substrates. This may introduce turbulence in the flow and may differently impact the gas diffusion distance of each of the wafer substrates. Due to asymmetry of the gas flow channel resulting from the bowing, the gas diffusion distance of one wafer substrate may be different than the gas diffusion distance of an opposing wafer substrate. In various embodiments, to address the bowing issue in larger diameter wafer substrates, a pneumatic device or a portion of a pneumatic device may be disposed over the back surface of at least one of the wafer substrates. For example, the pneumatic device may be a vacuum pump that applies a suction force through a hollowed shaft supporting the susceptor assembly to the back surface of one of the wafer substrates to modify the wafer substrate to create a mirror image of the other wafer substrate, i.e., reverse the direction and depth of the bowing of one of the wafer substrates so that the gas flow channel becomes symmetrical. Referring to FIG. 6A, the top substrate 901a and the bottom substrate 901b are both bowing downwards. Referring to FIG. 6B, a suction force is applied to the back surface of the top substrate 901a around the center area to change the direction and the depth of the bowing of the top substrate 901a so that it becomes a mirror image of the bottom substrate 901b. Referring to FIG. 3A, a suction force applied to the back surface 103a of the top substrate 101a may be introduced via shaft 124a.

The deposition chamber should have an optimized chamber geometry. Referring, for example, to FIG. 1B, the side wall 112 of the deposition chamber 110 may be configured to form a tubular portion and the first and second end walls 111a, 111b may be configured to form respective conical or funnel-shaped portions (i.e., domes) which are all aligned axially along their respective central axes. The conical portions are disposed at opposing opening ends of the tubular portion so that the bases of the conical portions (i.e., wider opening ends of the funnel-shaped portion) are facing each other. Thus, the volume of the deposition chamber 110 may be minimized to improve the gas yield and the deposition rate. Alternatively, referring, for example, to FIG. 2A, the side wall 1012 of the deposition chamber 1010 may be configured to form a rectangular portion and the first and second end walls 1011a, 1011b of the deposition chamber 1010 and the temperature control chambers 1015a, 1015b may be configured to form respective flat portions disposed at opposing ends of the rectangular portion. A rectangular deposition chamber may provide better doping uniformity.

A substrate handling system may be provided to position and remove wafer substrates or susceptors from the CVD reactor. In various embodiments, the substrate handling system may have a quartz plate which contacts a wafer substrate only at the surface near the outer edge of the wafer substrate (approximately 0.5 mm). The substrate handling system includes a grip that adheres to the surface of the wafer substrate by means of a vacuum, so that the wafer substrate can be deposited in any direction (horizontal, vertical, with or without susceptor inclination) on both susceptors. Referring to FIG. 1C, in various embodiments, the substrate handling system may include a ceramic handler 180 for handling removable susceptors. The ceramic handler is used to place and mount a susceptor onto a susceptor platform. The susceptor assemblies should be configured to provide access to a substrate handling system. For example, referring to FIG. 3A, the distance between the inductive heating elements 130a and the susceptor platform 122a and the distance between the susceptor platforms 122a and 122b should allow room for the substrate handling system to mount susceptors 121a and 121b. There may be two or more susceptor supports 123a. For example, referring to FIGS. 1F and 1H, there are three susceptor supports 123a formed as radial members extending from one end of a rotatable shaft 124a to points around the susceptor platform 122a. The radial spacing between each of the susceptor supports 123a should be arranged to allow mounting and removal of wafer substrates or susceptors. The radial spacing may be equidistant to provide stable support.

Once the wafer substrates are positioned in a deposition chamber 110 of a CVD reactor 100, the substrates may be heated by induction, radiation, or resistance heating, either directly or indirectly by heating the inductive plates disposed near the substrates or susceptors on which the substrates are supported, and then transferring the heat to the substrate.

A cleaning gas, such as hydrogen or a hydrogen mixture, is introduced in the deposition chamber to clean the front surfaces of the substrates (i.e., the surface facing away from the susceptor on which the thin film is to be deposited). The cleaning gas removes the native oxide from the front surfaces of the substrates, permitting the epitaxial layer to grow continuously and uniformly on the surface. Next process gases including a carrier, an element source, and a dopant are introduced in the deposition chamber. The carrier gas may be $H_2$. The vaporous source gas may be, for example, silane ($SiH_4$), disilane ($Si_2H_6$), germane ($GeH_4$), silicon tetrachloride ($SiCl_4$), or a chlorosilane ($SiHCl_3$ or $SiH_2Cl_2$). For SiC epitaxy, the vaporous source gas may also be silane or trichlorosilane and propene ($C_3H_6$) or methane ($CH_4$). The dopant gas may be $PH_3$, $AsH_3$, and $B_2H_6$. The process gases react with the front surfaces of the substrates to grow an epitaxial layer of silicon. The substrates may be rotated about their central axes during the process to ensure the epitaxial layer grows uniformly.

In various embodiments, the additional use of a cooling chamber to faciliate the cooling of processed wafer substrates before they leave the deposition chamber may further increase the throughput. The cooling chamber should have a very small volume. For example, the active cooling of a deposition chamber made of quartz may be realized by applying a flowing liquid coolant directly to the outer surfaces of the quartz wall. In various embodiments, the temperature control chamber 115a of the CVD reactor 100 may be configured to be a heating and cooling chamber by adding a water supply and drain system. For another example, a water inlet pipe may be disposed over the CVD reactor 100 to provide cool water to the temperature control chamber 115a. When the deposition reaction is completed, cool water flow may be introduced into the temperature control chamber 115a to cool the end wall 111a of the CVD reactor 100 and water may be drained via discharge pipes. The end wall 111b may be similarly cooled.

By-products of the deposition process may form on the walls of the deposition chamber and various parts of the susceptor assembly (which may include inductive heating elements and inductive plates). After the substrates are removed from the deposition chamber, the residual by-products may be removed by any well-known and suitable cleaning process. When a cleaning process involving standard cleaning gases is used to remove by-products formed on any quartz material in the deposition chamber, a lamp heating element may be needed to provide heat to facilitate the cleaning process. Alternatively, a cleaning process based on thermochemical cleaning with additional energy excitation may be used without a heating element. Such a thermochemical cleaning process may also reduce the cleaning time.

In various embodiments, more than two wafer substrates may be processed simultaneously. FIGS. 5A and 5B show various configurations of a batch CVD reactor having a plurality of susceptor assembly pairs according to at least one embodiment. FIG. 5A shows a batch CVD reactor 600 that can process four wafer substrates simultaneously. Referring to FIG. 5A, a batch CVD reactor 600 has two susceptor assembly pairs in a deposition chamber. A second susceptor assembly pair 620a', 620b' is disposed adjacent to a first susceptor assembly pair 620a, 620b where the susceptor assemblies 620a and 620a' aligned in one plane, and the susceptor assemblies 620b and 620b' are aligned in an opposing plane so as to form a symmetrical and continuous gas flow channel having an extended length. Additional susceptor assembly pairs may be similarly disposed to extend the length of the gas flow channel. The opposing surfaces of the gas flow channel formed by the substrate mounted susceptor assembly pairs may be parallel to each other or they may be inclined towards each other as shown in FIGS. 4A-4D. The configuration of each of these susceptor assembly pairs may be identical or similar to each other.

Referring to FIG. 5B, a batch CVD reactor 700 has two susceptor assembly pairs in a deposition chamber. A second susceptor assembly pair 720a', 720b' is disposed adjacent to a first susceptor assembly pair 720a, 720b where the susceptor assemblies 720a and 720a' aligned in one plane, and the susceptor assemblies 620b and 620b' are aligned in an opposing plane so as to form a symmetrical and continuous gas flow channel having an extended width. Additional susceptor assembly pairs may be similarly disposed to extend the width of the gas flow channel. The opposing walls of the gas flow channel formed by the substrate mounted susceptor assembly pairs may be parallel to each other or they may be inclined towards each other as shown in FIGS. 4A-4D. The configuration of each of these susceptor assembly pairs may be identical or similar to each other.

Figure 5C:
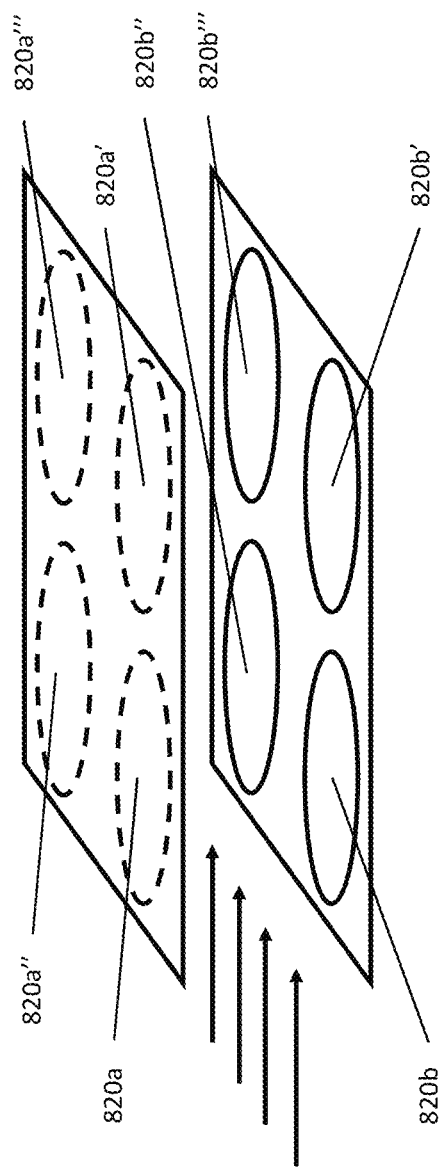

Referring to FIG. 5C, a batch CVD reactor 800 has four susceptor assembly pairs in a deposition chamber. The four susceptor assembly pairs are disposed adjacent to each other where the susceptor assemblies 820a, 820a', 820a", and 820a''' are aligned in one plane, and the susceptor assemblies 820b and 820b', 820b", and 820b''' are aligned in an opposing plane so as to form a continuous gas flow channel having an extended length and width. Additional susceptor assembly pairs may be similarly disposed to extend the length and width of the gas flow channel. The opposing walls of the gas flow channel formed by the substrate mounted susceptor assembly pairs may be parallel to each other or they may be inclined towards each other as shown in FIGS. 4A-4D. The configuration of each of these susceptor assembly pairs may be identical or similar to each other.

The apparatus and method described herein is scalable for all substrate diameters, geometrical shapes, and thicknesses.

In accordance with various embodiments, isothermal conditions on two substrates may be generated at the same time. Consequently, an identical epitaxial layer with respect to uniformity of layer thickness and dopant distribution may be generated on the substrates. Because there are two reactive process surfaces, there is an increased throughput given the same process time, an improved usage of the process gases, and a reduction of parasitic deposition on the chamber walls.

In the following, various aspects of this disclosure will be illustrated:

Example 1 is a CVD reactor including a deposition chamber housing a first susceptor and a second susceptor, the first susceptor configured to receive a first substrate, the first substrate comprising a front surface and a back surface, the second susceptor configured to receive a second substrate, the second substrate comprising a front surface and a back surface, and the first susceptor and the second susceptor are disposed so that the front surface of the first substrate is opposite to the front surface of the second substrate thereby forming a portion of a gas flow channel.

In Example 2, the subject matter of Example 1 can optionally include that the first and second susceptors are rotatable about their respective central axes.

In Example 3, the subject matter of Example 1 or 2 can optionally include that a central axis of the first susceptor is aligned with a central axis of the second susceptor.

In Example 4, the subject matter of any of Examples 1-3 can optionally include that the front surface of the first substrate is parallel to the front surface of the second substrate.

In Example 5, the subject matter of any of Examples 1-4 can optionally include that the front surface of the first substrate and the front surface of the second substrate are inclined towards each other.

In Example 6, the subject matter of any of Examples 1-5 can optionally include that at least one gas inlet and at least one gas outlet provided in a side wall of the deposition chamber, the at least one gas inlet and the at least one gas outlet are disposed opposite each other and are aligned with the gas flow channel.

In Example 7, the subject matter of any of Examples 1-6 can optionally include a first set of one or more heating elements to heat the first substrate and a second set of one or more heating elements to heat the second substrate.

In Example 7a, the subject matter of Example 7 can optionally include that the first set of the one or more heating elements includes a set of one or more lamp heating elements disposed on the back surface side of the first substrate and the second set of the one or more heating elements includes a set of one or more lamp heating elements disposed on the back surface side of the second substrate.

In Example 7b, the subject matter of Example 7 can optionally include that the first set of the one or more heating elements includes a set of one or more resistive heating elements disposed on the back surface side of the first substrate and the second set of the one or more heating elements includes a set of one or more resistive heating elements disposed on the back surface side of the second substrate.

In Example 7c, the subject matter of Example 7 can optionally include that the first set of the one or more heating elements includes a set of one or more microwave heating elements and the second set of the one or more heating elements includes a set of one or more microwave heating elements.

In Example 7d, the subject matter of Example 7 can optionally include that the first set of the one or more heating elements includes a set of one or more lamp heating elements and a set of one or more inductive heating elements and the second set of the one or more heating elements includes a set of one or more lamp heating elements and a set of one or more inductive heating elements.

In Example 7e, the subject matter of Example 7 can optionally include that the first set of the one or more heating elements includes a set of one or more lamp heating elements and a set of one or more microwave heating elements and the second set of the one or more heating elements includes a set of one or more lamp heating elements and a set of one or more microwave heating elements.

In Example 7f, the subject matter of Example 7 can optionally include that the first set of the one or more heating elements includes a set of one or more inductive heating elements and a set of one or more microwave heating elements and the second set of the one or more heating elements includes a set of one or more inductive heating elements and a set of one or more microwave heating elements.

In Example 7g, the subject matter of Example 7 can optionally include that each of the one or more heating elements includes a protective coating, wherein each of the one or more heating elements is disposed in the deposition chamber.

In Example 7h, the subject matter of Example 7 can optionally include that each of the one or more heating elements includes a reflective coating, wherein each of the one or more heating elements is disposed between a respective substrate and one or more lamp heating elements.

In Example 8, the subject matter of any of Examples 7-7h can optionally include that the one or more heating elements are separately controllable.

In Example 9, the subject matter of Examples 7-8 can optionally include that the first set of the one or more heating elements includes a first set of one or more inductive heating elements disposed on the back surface side of the first substrate and the second set of the one or more heating elements includes a second set of one or more inductive heating elements disposed on the back surface side of the second substrate.

In Example 10, the subject matter of Examples 9 can optionally include a first inductive plate disposed on the back surface side of the first substrate and a second inductive plate disposed on the back surface side of the second substrate.

In Example 10a, the subject matter of Example 9-10 can optionally include that each of the first and second sets of the one or more inductive heating elements includes a first inductive heating element having a first configuration and a second inductive heating element having a second configuration.

In Example 10b, the subject matter of Example 10a can optionally include that the second inductive heating element provides more heat than the first inductive heat element.

In Example 10c, the subject matter of Example 10b can optionally include that the first inductive heating element is provided over an edge portion of a respective substrate and the second inductive heating element is provided over a center portion of a respective substrate.

In Example 10d, the subject matter of any of Examples 10a-10c can optionally include that the first and second inductive heat elements are disposed at different distances from a respective substrate.

In Example 10e, the subject matter of any of Examples 10a-10d can optionally include that the first and second inductive heating elements operates at different frequencies.

In Example 10f, the subject matter of any of Examples 10a-10e can optionally include that the first and second inductive heating elements overlap.

In Example 10g, the subject matter of any of Examples 9-10f can optionally include that the first and second sets of the one or more inductive heating elements are disposed in the deposition chamber, wherein each of the one or more inductive heating elements includes a protective coating.

In Example 10h, the subject matter of any of Examples 9-10f can optionally include that the one or more inductive heating elements includes a reflective coating, wherein the one or more inductive heating elements are disposed between a respective substrate and one or more lamp heating elements.

In Example 11, the subject matter of any of Examples 1-10h can optionally include a first temperature control chamber and a second temperature control chamber, and wherein the deposition chamber includes a first end wall and a second end wall, the first and second end walls coupled to the side wall, and wherein the deposition chamber is coupled to the first and second temperature control chambers so that the first end wall is common between the deposition chamber and the first temperature control chamber and the second end wall is common between the deposition chamber and the second temperature control chamber.

In Example 12, the subject matter of any of Examples 1-11 can optionally include that wherein the first set of the one or more heating elements comprises a first set of one or more lamp heating elements and the second set of the one or more heating elements comprises a second set of one or more lamp heating elements, and wherein the first set of one or more lamp heating elements is disposed in the first temperature control chamber and the second set of one or more lamp heating elements is disposed in the second temperature control chamber.

In Example 12a, the subject matter of any of Examples 1-11 can optionally include that the first temperature control chamber houses one or more inductive heating elements and the second temperature control chamber houses one or more inductive heating elements.

In Example 12b, the subject matter of any of Examples 1-12a can optionally include that the first set of one or more lamp heating elements are uniformly distributed and the second set of one or more lamp heating elements are uniformly distributed.

In Example 13, the subject matter of any of Examples 1-12b can optionally include that the side wall comprises a thermally conductive material and the first and second end walls comprise a thermally isolating material.

Example 14 is a method of processing at least two substrates in a CVD reactor. The method includes providing a first substrate comprising a front surface and a back surface and a second substrate comprising a front surface and a back surface, arranging the first and second substrates so that the front surface of the first substrate is disposed opposite the front surface of the second substrate thereby forming a portion of a gas flow channel, and providing a flow of process gas through at least the portion of the gas flow channel formed by the opposing front surfaces of the first and second substrates.

In Example 15, the subject matter of Example 14 can optionally include rotating the first and second substrates about their respective central axes.

In Example 16, the subject matter of any of Examples 14-15 can optionally include arranging the first and second substrates so that the front surface of the first substrate is parallel to the front surface of the second substrate.

In Example 17, the subject matter of any of Examples 14-16 can optionally include arranging the first and second substrates so that the front surface of the first substrate and the front surface of the second substrate are inclined towards each other.

In Example 18, the subject matter of any of Examples 14-17 can optionally include that the first substrate and the second substrate are symmetrically configured.

In Example 19, the subject matter of Examples 14-18 can optionally include heating the first and second substrates.

In Example 19a, the subject matter of any of Examples 14-19 can optionally include heating the first and second substrates using two types of heating elements.

In Example 19b, the subject matter of any of Examples 14-19a can optionally include that wherein the two types of heating elements comprises a rapid heating type and a slow heating type.

In Example 19c, the subject matter of any of Examples 14-19b can optionally include using a rapid heating type element to heat the first and second substrates to an intermediate temperature and using a slow heating type element to heat the first and second substrates to a process temperature.

In Example 19d, the subject matter of any of Examples 14-19c can optionally include that wherein the rapid heating type element includes a lamp heating element and the slow heating type element includes an induction heating element.

In Example 19e, the subject matter of any of Examples 14-19c can optionally include that wherein the rapid heating type element includes a microwave heating element and the slow heating type element includes an induction heating element.

In Example 19f, the subject matter of any of Examples 14-19e can optionally include that wherein the two types of heating elements are used sequentially.

In Example 19g, the subject matter of any of Examples 14-19e can optionally include that wherein the two types of heating elements are used simultaneously.

In Example 20, the subject matter of any of Examples 14-19d can optionally include pre-heating the process gas.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A CVD reactor, comprising:
a deposition chamber housing a first susceptor and a second susceptor, the deposition chamber comprising at least one gas inlet and at least one gas outlet;
the first susceptor configured to receive a first substrate, the first substrate comprising a front surface and a back surface, wherein the first susceptor includes a front surface and a back surface opposite the front surface, wherein the front surface of the first susceptor comprises a recess configured to receive the first substrate;
the second susceptor configured to receive a second substrate, the second substrate comprising a front surface and a back surface, wherein the second susceptor includes a front surface and a back surface opposite the front surface, wherein the front surface of the second susceptor comprises a recess configured to receive the second substrate,
wherein the first susceptor is disposed over the second susceptor so that the front surface of the first susceptor is vertically above and opposite the front surface of the second susceptor thereby forming a portion of a horizontal gas flow channel between the at least one gas inlet and the at least one gas outlet and the front surface of the first substrate is configured to be vertically above and opposite the front surface of the second substrate thereby forming another portion of the horizontal gas flow channel between the at least one gas inlet and the at least one gas outlet,
wherein the front surfaces of the first susceptor and first substrate and the front surfaces of the second susceptor and second substrate are configured to be inclined towards each other so that the horizontal gas flow channel gradually tapers from the at least one gas inlet towards the at least one gas outlet,
wherein a center of the first susceptor is opposite a center of the second susceptor,
wherein the recess in the front surface of the first susceptor is configured to tightly and fixedly receive the first substrate so that the back surface of the first substrate is spaced apart from the first susceptor and an interaction between the process gas and the back surface of the first substrate is minimized and wherein the recess in the front surface of the second susceptor is configured to tightly and fixedly receive the second substrate so that the back surface of the second substrate is spaced apart from the second susceptor and an interaction between the process gas and the back surface of the second substrate is minimized,
wherein the front surface of the first susceptor and the front surface of the second susceptor are opposite of each other and symmetrically arranged,
wherein the recess of at least one of the first susceptor and the second susceptor includes a hole extending through a center of the at least one of the first susceptor and the second susceptor, further including a hollow shaft coupled to the at least one of the first susceptor and the second susceptor, wherein the hollow shaft is coupled to a pneumatic device and is configured to be disposed over the back surface of at least one of the first substrate and the second substrate to thereby provide a suction force to change a direction and depth of a bowing of the at least one of the first substrate and the second substrate.

2. The CVD reactor of claim 1, wherein the first and second susceptors are rotatable about their respective central axes.

3. The CVD reactor of claim 1, wherein the deposition chamber comprises a side wall around the first and second susceptor, wherein the side wall comprises the at least one gas inlet and the at least one gas outlet, the at least one gas inlet and the at least one gas outlet are disposed opposite each other and are aligned with the gas flow channel.

4. The CVD reactor of claim 2, further comprising:
at least one heating element configured to heat the first substrate and at least one other heating element configured to heat the second substrate, wherein
the at least one heating element comprises a first set of one or more heating elements configured to heat the first substrate; and
the at least one other heating element comprises a second set of one or more heating elements configured to heat the second substrate.

5. The CVD reactor of claim 4, wherein each of the one or more heating elements are separately controllable.

6. The CVD reactor of claim 4, wherein the first set of the one or more heating elements comprises a first set of one or more inductive heating elements disposed on the back surface side of the first substrate and the second set of the one or more heating elements comprises a second set of one or more inductive heating elements disposed on the back surface side of the second substrate.

7. The CVD reactor of claim 4, further comprising:
a first temperature control chamber and a second temperature control chamber; and
wherein the deposition chamber comprises a side wall around the first susceptor and the second susceptor and a first end wall and a second end wall, the first and second end walls coupled to the side wall, and wherein the deposition chamber is coupled to the first and second temperature control chambers so that the first end wall is common between the deposition chamber and the first temperature control chamber and the second end wall is common between the deposition chamber and the second temperature control chamber.

8. The CVD reactor of claim 7, wherein the first set of the one or more heating elements comprises a first set of one or more lamp heating elements and the second set of the one or more heating elements comprises a second set of one or more lamp heating elements, and wherein the first set of one or more lamp heating elements is disposed in the first temperature control chamber and the second set of one or more lamp heating elements is disposed in the second temperature control chamber.

9. The CVD reactor of claim 7, wherein the side wall comprises a thermally insulating material and the first and second end walls comprise a thermally conductive material.

10. A method of processing at least two substrates in a CVD reactor, the method comprising:
providing a deposition chamber housing a first susceptor and a second susceptor, wherein the deposition chamber is configured with at least one gas inlet and at least one gas outlet,
wherein the first susceptor includes a front surface and a back surface opposite the front surface, wherein the front surface of the first susceptor includes a recess configured to receive a first substrate,
wherein the second susceptor includes a front surface and a back surface opposite the front surface, wherein the front surface of the second susceptor includes a recess configured to receive a second substrate;
arranging the first susceptor over the second susceptor so that the front surface of the first susceptor is over and opposite the front surface of the second susceptor thereby forming a portion of a horizontal gas flow channel between the at least one gas inlet and the at least one gas outlet and the front surface of the first substrate is disposed over and opposite the front surface of the second substrate thereby forming another portion of the horizontal gas flow channel between the at least one gas inlet and the at least one gas outlet, wherein the front surfaces of the first susceptor and first substrate and the front surfaces of the second susceptor and second substrate are configured to be inclined towards each other so that the horizontal gas flow channel gradually tapers from the at least one gas inlet towards the at least one gas outlet; and
providing a flow of process gas from the at least one gas inlet through the horizontal gas flow channel to the at least one gas outlet,
wherein a center of the first susceptor is opposite a center of the second susceptor,
wherein the recess in the front surface of the first susceptor is configured to tightly and fixedly receive the first substrate so that the back surface of the first substrate is spaced apart from the first susceptor and an interaction between the process gas and the back surface of the first substrate is minimized and wherein the recess in the front surface of the second susceptor is configured to tightly and fixedly receive the second substrate so that the back surface of the second substrate is spaced apart from the second susceptor and an interaction between the process gas and the back surface of the second substrate is minimized
wherein the front surface of the first susceptor and the front surface of the second susceptor are opposite of each other and symmetrically arranged,
wherein the recess of at least one of the first susceptor and the second susceptor includes a hole extending through a center of the at least one of the first susceptor and the second susceptor, further including a hollow shaft coupled to the at least one of the first susceptor and the second susceptor, wherein the hollow shaft is coupled to a pneumatic device and is configured to be disposed over the back surface of at least one of the first substrate and the second substrate to thereby provide a suction force to change a direction and depth of a bowing of the at least one of the first substrate and the second substrate.

11. The method of claim 10, further comprising:
rotating the first and second substrates about their respective central axes.

12. The method of claim 10, wherein the first substrate and the second substrate are symmetrically configured.

13. The CVD reactor of claim 1, further comprising:
at least one heating element configured to heat the first substrate and at least one other heating element configured to heat the second substrate.

14. The CVD reactor of claim 13, wherein the at least one heating element or the at least one other heating element includes an inductive spiral metal coil.

15. The CVD reactor of claim 14, wherein a spacing between each winding of the inductive spiral metal coil may vary horizontally and/or vertically.

16. The CVD reactor of claim 14, the at least one heating element includes a first inductive heating element and a first lamp heating element and the at least one other heating element includes a second inductive heating element and a second lamp heating element.

17. The CVD reactor of claim 16, wherein the first inductive heating element includes an inductive coil having a coating of reflective metal.

* * * * *